US007754083B2

(12) United States Patent
Sirkar et al.

(10) Patent No.: US 7,754,083 B2
(45) Date of Patent: Jul. 13, 2010

(54) SOLID HOLLOW FIBER COOLING CRYSTALLIZATION SYSTEMS AND METHODS

(75) Inventors: Kamalesh K. Sirkar, Bridgewater, NJ (US); Dimitrios Zarkadas, Kearny, NJ (US)

(73) Assignee: New Jersey Institute of Technology, Newark, NJ (US)

( * ) Notice: Subject to any disclaimer, the term of this patent is extended or adjusted under 35 U.S.C. 154(b) by 0 days.

(21) Appl. No.: 12/114,315

(22) Filed: May 2, 2008

(65) Prior Publication Data
US 2009/0000080 A1  Jan. 1, 2009

Related U.S. Application Data

(62) Division of application No. 11/259,184, filed on Oct. 26, 2005, now abandoned.

(60) Provisional application No. 60/625,915, filed on Nov. 8, 2004.

(51) Int. Cl.
*B01D 11/00* (2006.01)
*B01D 61/00* (2006.01)
*C02F 5/00* (2006.01)

(52) U.S. Cl. .................. 210/645; 210/656; 210/198.2; 210/321.8; 210/635

(58) Field of Classification Search ............ 210/645, 210/656, 198.2, 321.8, 635
See application file for complete search history.

(56) References Cited

U.S. PATENT DOCUMENTS

| | | | |
|---|---|---|---|
| 3,874,439 A | 4/1975 | Korshunov et al. | |
| 3,918,916 A | 11/1975 | Garrett | |
| 4,348,371 A | 9/1982 | Saeman | |
| 4,404,038 A | 9/1983 | Credoz et al. | |
| 5,034,105 A | 7/1991 | Berglund et al. | |
| 5,523,064 A | 6/1996 | Schranz | |
| 6,022,477 A | 2/2000 | Luo et al. | |
| 6,156,096 A | 12/2000 | Sirkar | |

(Continued)

OTHER PUBLICATIONS

Phillips, Mineral Optics Principles and Techniques, Table of Contents, Jan. 1971, 6 sheets.

(Continued)

*Primary Examiner*—G. Nagesh Rao
(74) *Attorney, Agent, or Firm*—McCarter & English, LLP

(57) ABSTRACT

A solid hollow fiber cooling crystallizer and method for crystallizing aqueous and organic solutions are provided. The solid hollow fiber crystallizer (SHFC) for carrying out cooling crystallization of inorganic/organic microsolutes/macrosolutes from solution generally includes a bundle of nonporous hollow fibers mounted within a shell where a feed solution for crystallization flows through the lumen side of the hollow fibers and a cooling solution flows through the shell side to form nuclei and subsequently crystals in the feed solution at a temperature below its saturation temperature. The solid hollow fiber crystallizer may be combined with a mixing device, such as a completely stirred tank or static mixer, to further effectuate crystallization. The solid hollow fiber crystallizer may be operated in a number of modes including feed recycle mode, once through mode, SHFC-inline static mixer in series mode, and SHFC-CST in series mode. The advantages of solid hollow fiber cooling crystallization in comparison to conventional crystallization processes include improved temperature control between crystallizing solution and coolant, higher nucleation rates, improved control of crystal size and crystal size distribution, smaller crystal size, capability for decoupling crystal nucleation and crystal growth, decreased fouling of process equipment, and improved process scale-up.

15 Claims, 29 Drawing Sheets

Solid Hollow Fiber Cooling Crystallization experimental setup.

U.S. PATENT DOCUMENTS

| | | | |
|---|---|---|---|
| 6,355,173 | B1 | 3/2002 | Den Bieman et al. |
| 6,478,966 | B2 | 11/2002 | Zhou et al. |
| 6,613,504 | B2 | 9/2003 | Oyamada et al. |
| 6,623,545 | B2 | 9/2003 | Thordarson et al. |
| 6,838,069 | B2 | 1/2005 | Blonigen et al. |
| 6,986,847 | B2 | 1/2006 | Sirkar et al. |
| 2001/0033816 | A1 | 10/2001 | Blonigen et al. |
| 2001/0037976 | A1 | 11/2001 | Blonigen et al. |
| 2002/0090582 | A1 | 7/2002 | Oyamada et al. |
| 2003/0215377 | A1 | 11/2003 | Blonigen et al. |
| 2005/0061149 | A1 | 3/2005 | Nieuwenhuizen et al. |
| 2007/0068640 | A1* | 3/2007 | Pfalzer et al. .................. 162/9 |
| 2007/0107861 | A1* | 5/2007 | Doelle et al. .................. 162/9 |
| 2007/0119561 | A1* | 5/2007 | Doelle et al. ............. 162/181.2 |
| 2007/0289105 | A1* | 12/2007 | Sirkar et al. ............. 23/295 R |
| 2009/0000080 | A1* | 1/2009 | Sirkar et al. .................. 23/301 |

OTHER PUBLICATIONS

Miller, Modeling and quality Control Strategies for Batch Cooling Crystallizers, The University of Texas at Austin, May 1993.

Rolfs, Crystallization of Potassium Nitrate ($KNO_3$) In Aqueous Solution, Journal of Crystal Growth, 1997, vol. 171, pp. 174-182.

Helt, et al., Effects of Temperature on the Crystallization of Potassium Nitrate by Direct Measurement of Supersaturation, AIChE Journal, Nov. 1977, vol. 23, pp. 822-830.

Junaszek, et al., Influence of Fines Dissolving on Crystal Size Distribution in an MSMPR Crystallizer, AIChE Journal, Jul. 1977, vol. 23, pp. 460-468.

Tavare, et al., Precipitation of Salicylic Acid: Hydrotropy and Reaction, Ind. Eng. Chem. Res., 1991, vol. 30, pp. 722-728.

Blandin, Kinetcs Identification of Salicylic Acid Precipitation Through Experiments in a Batch Stirred Vessel and a T-Mixer, Chemical Engineering Journal, 2001, vol. 81, pp. 91-100.

Zarkadas et al., Solid Hollow Fiber Cooling Crystallization, Sep. 29, 2004, American Chemical Society, Ind. Eng. Chem. Res. 2004, 43, pp. 7163-7180.

\* cited by examiner

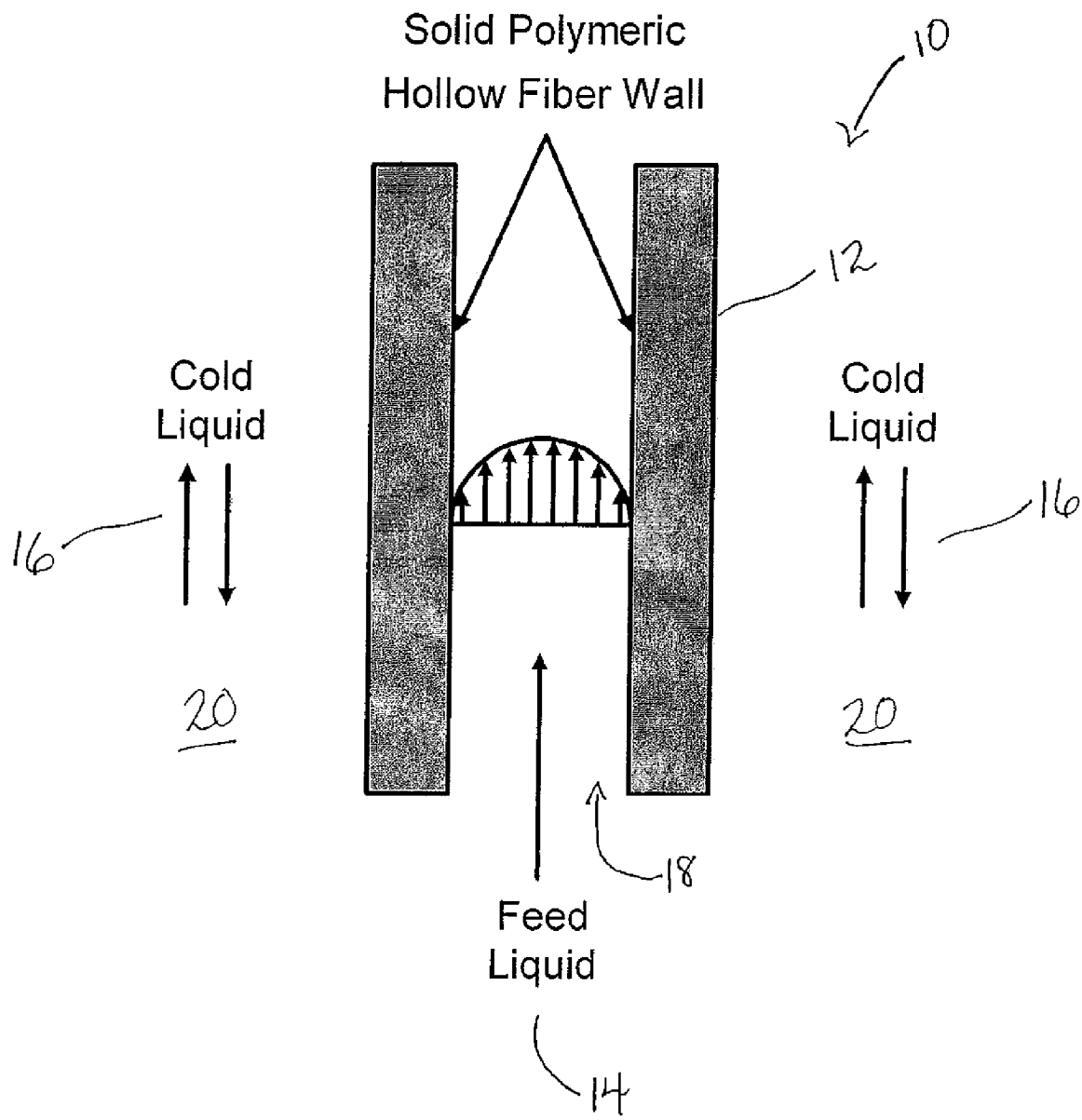
Figure 1. Solid Hollow Fiber Cooling Crystallization: Operating principle.

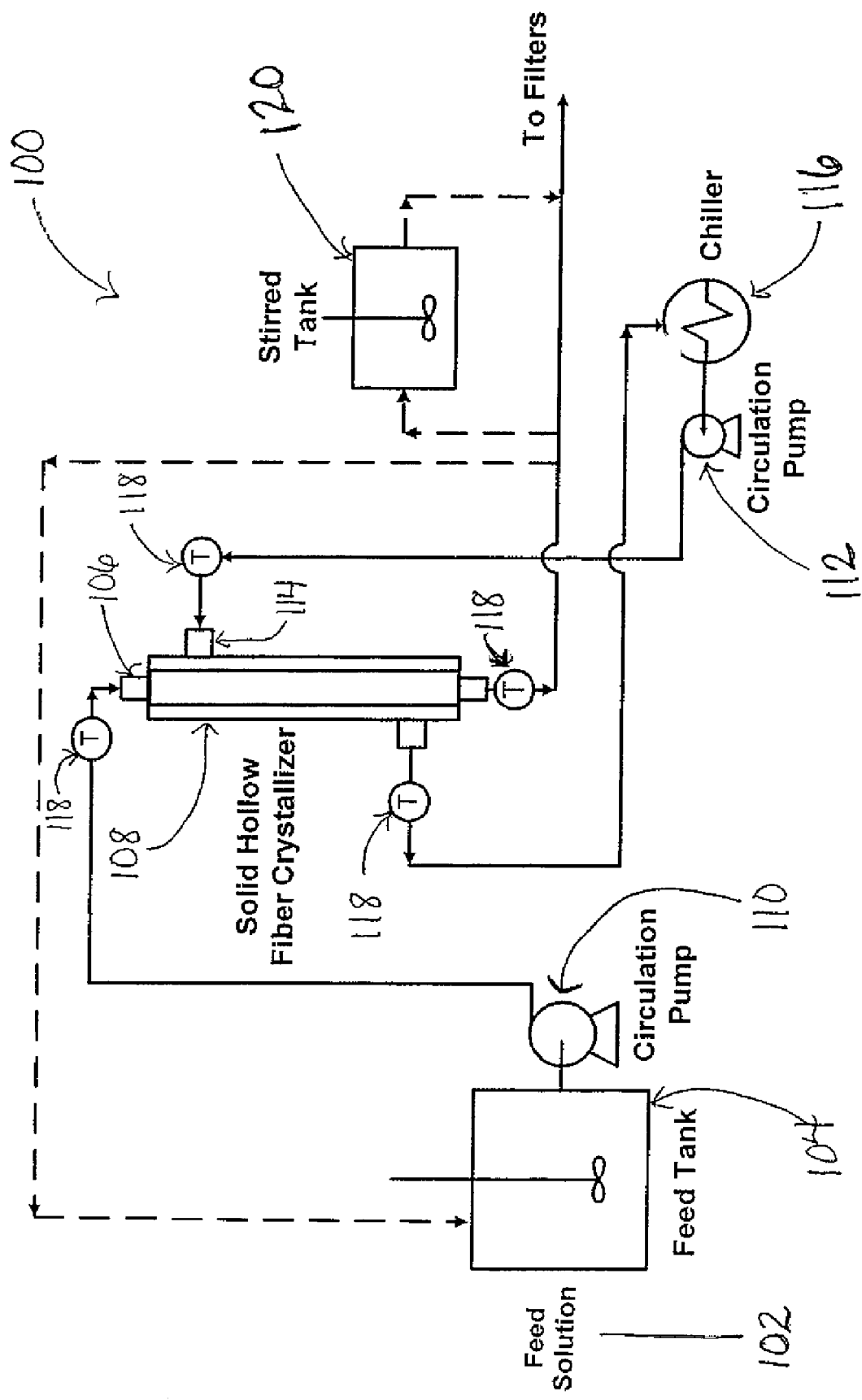
Figure 2. Solid Hollow Fiber Cooling Crystallization experimental setup.

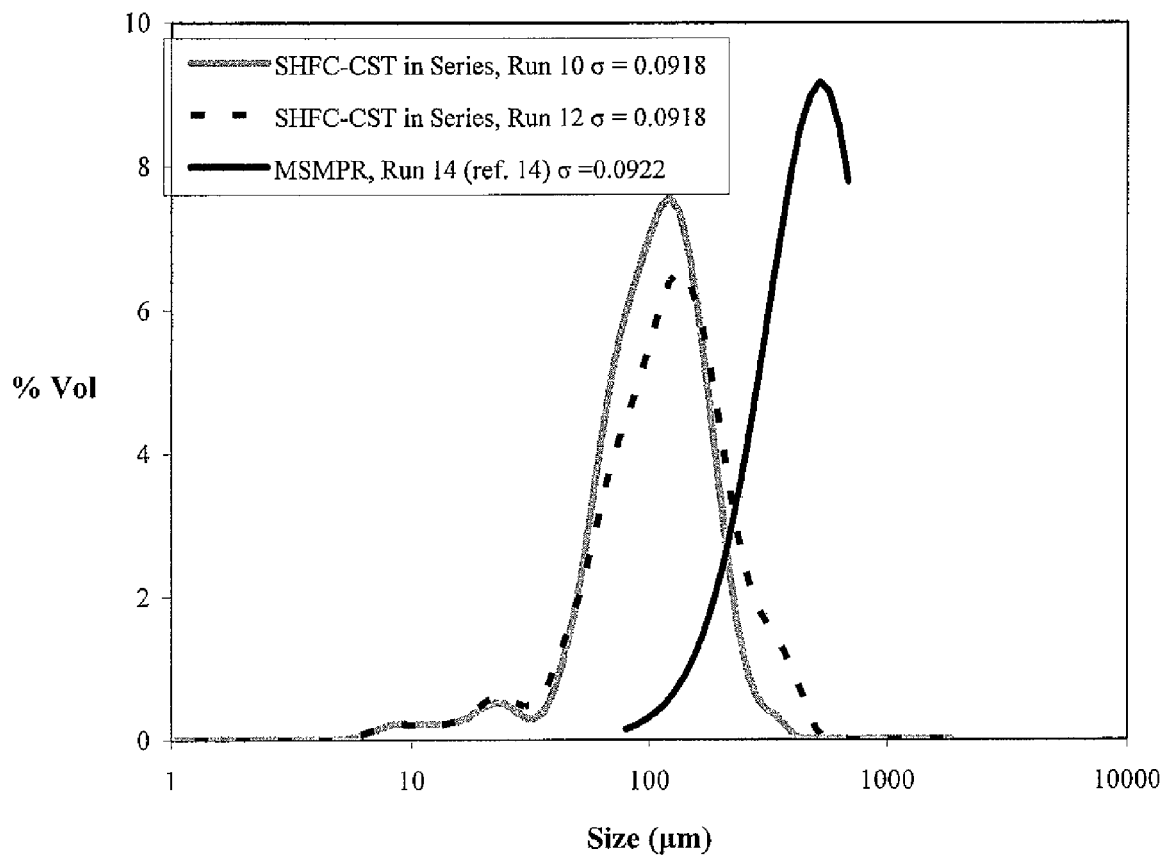
Figure 3. KNO$_3$ crystallization from aqueous solutions: % Volume differential CSD for the SHFC-CST in series operation mode. Operating conditions: a) Run 10: $C_f$ = 0.382 g/g, $T_{f,in}$ = 27.3°C, $T_{f,out}$ = 22.3 °C, $T^*$ = 24.6°C, $Re_f$ = 140, $\tau_{CST}$ = 120 s; b) Run 12: $C_f$ = 0.382 g/g, $T_{f,in}$ = 28.4°C, $T_{f,out}$ = 22.3 °C, $T^*$ = 24.6°C, $Re_f$ = 143, $\tau_{CST}$ = 120 s.

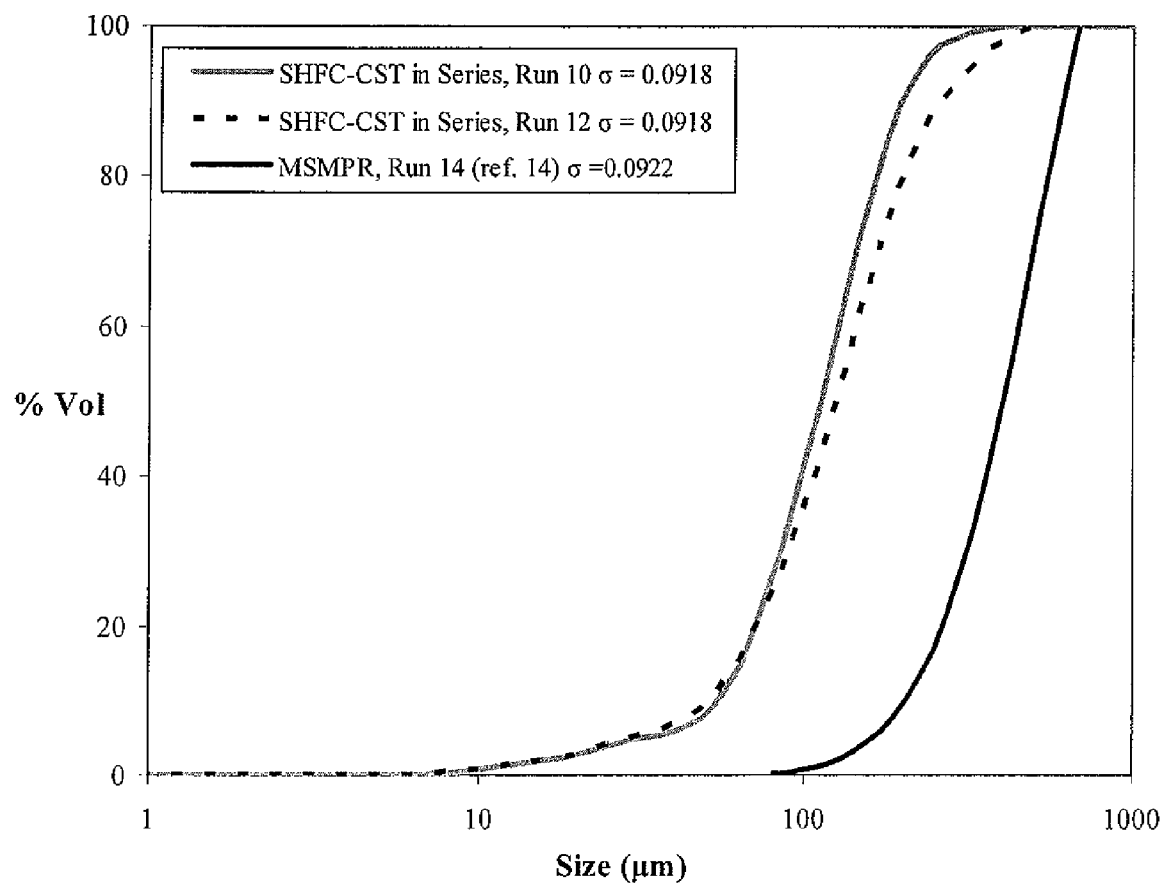
Figure 4. KNO₃ crystallization from aqueous solutions: % Volume cumulative undersize CSD for the SHFC-CST in series operation mode. Operating conditions as in Figure 3.

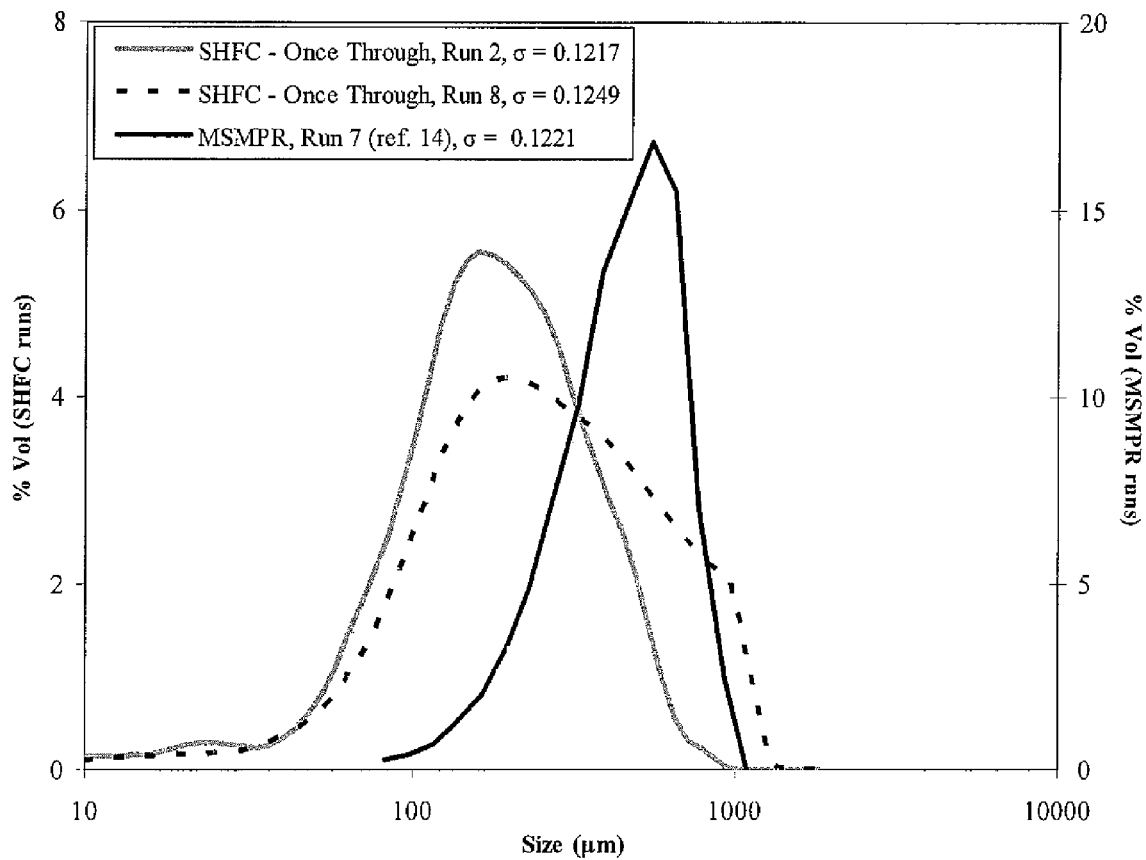
Figure 5. KNO₃ crystallization from aqueous solutions: % Volume differential CSD for the SHFC once through operation mode. Operating conditions: a) Run 2: $C_f$ = 0.363 g/g, $T_{f,in}$ = 27.3°C, $T_{f,out}$ = 20.3 °C, $T^*$ = 23.3°C, $Re_f$ = 55; b) Run 8: $C_f$ = 0.370 g/g, $T_{f,in}$ = 28.6°C, $T_{f,out}$ = 20.7°C, $T^*$ = 23.8°C, $Re_f$ = 147.

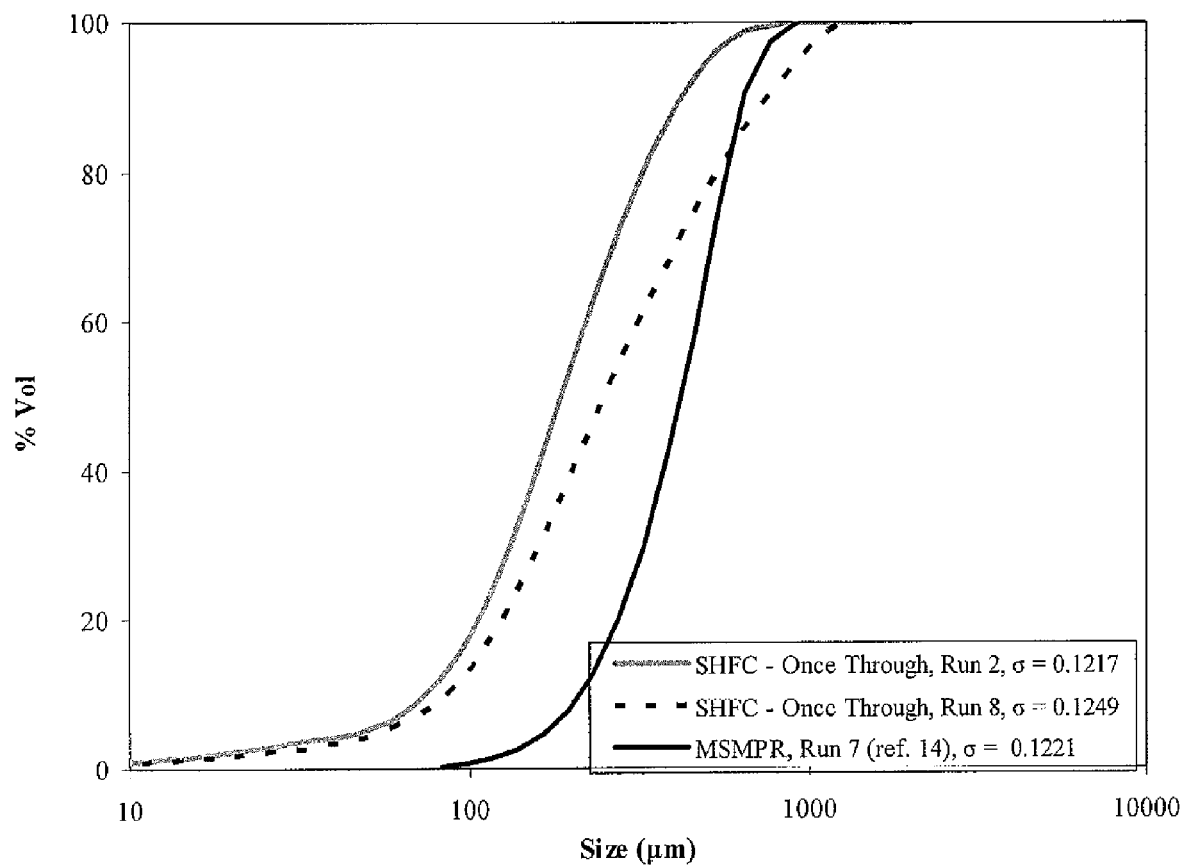
Figure 6. KNO$_3$ crystallization from aqueous solutions: % Volume cumulative undersize CSD for the SHFC once through operation mode. Operating conditions: same as in Figure 5.

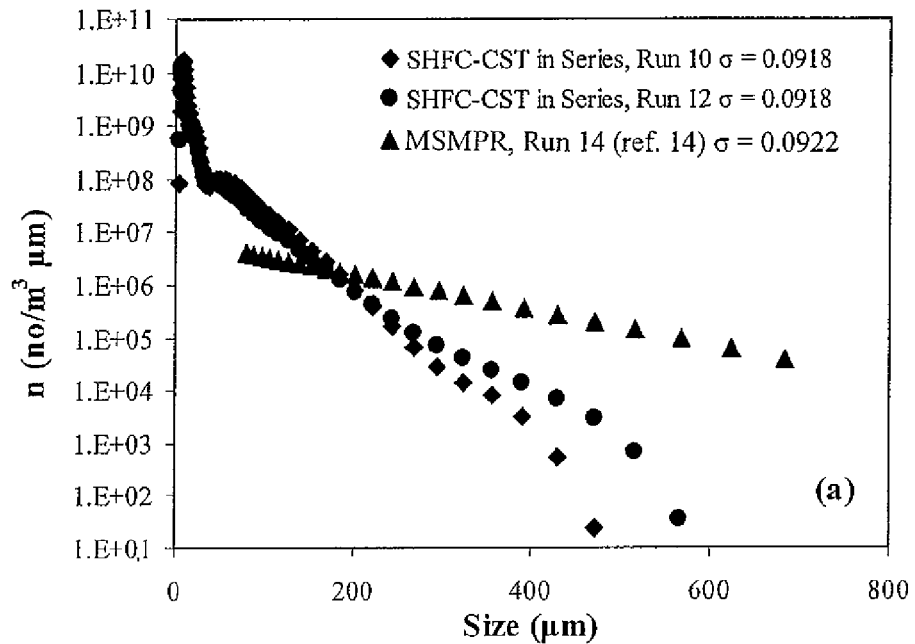
Figure 7a. KNO$_3$ crystallization from aqueous solutions. Population density curves obtained with solid hollow fiber cooling crystallization: (a) SHFC-CST in series..
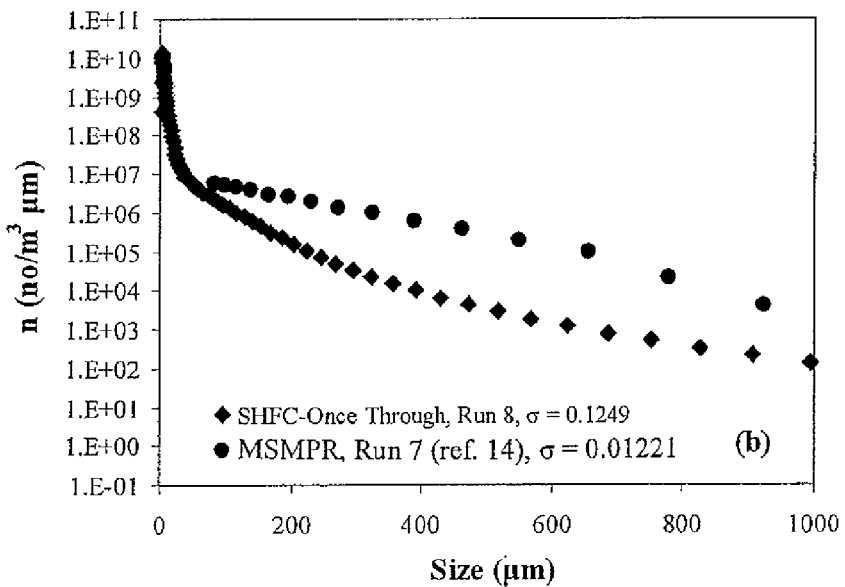
Figure 7b. KNO$_3$ crystallization from aqueous solutions. Population density curves obtained with solid hollow fiber cooling crystallization: (b) SHFC once through operation mode.

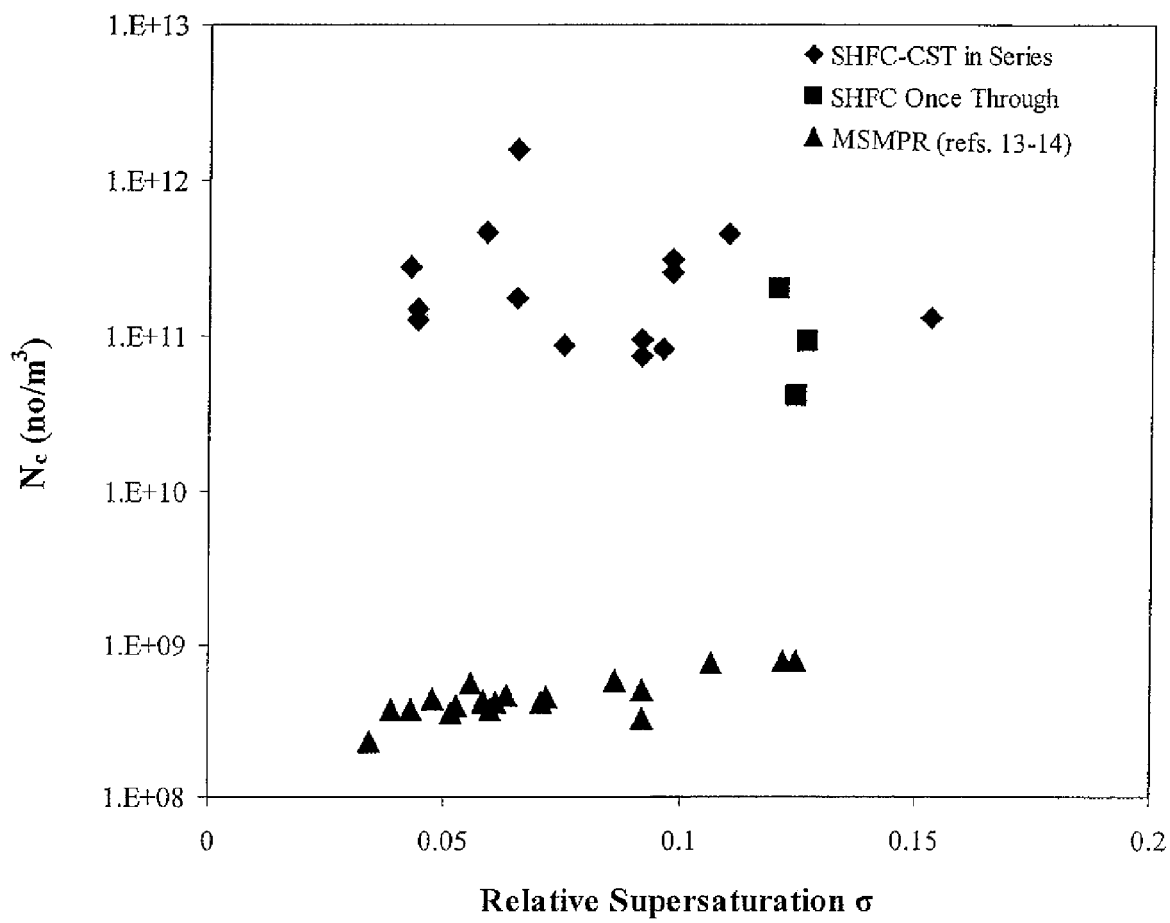
Figure 8. Number of $KNO_3$ crystals generated per unit volume: Solid hollow fiber cooling crystallization vs. MSMPR data.

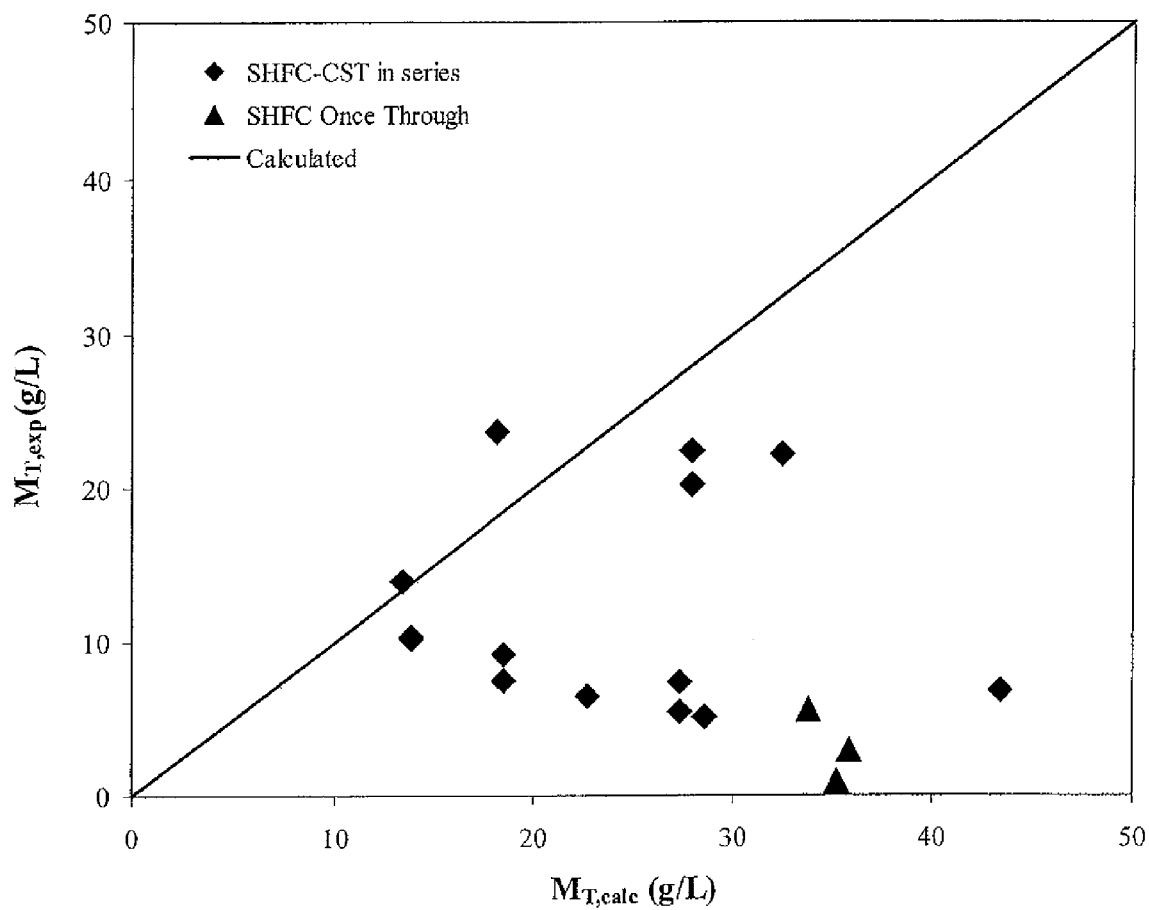
Figure 9. KNO₃ crystallization from aqueous solutions: Comparison of experimental and magma density values calculated by equation (7).

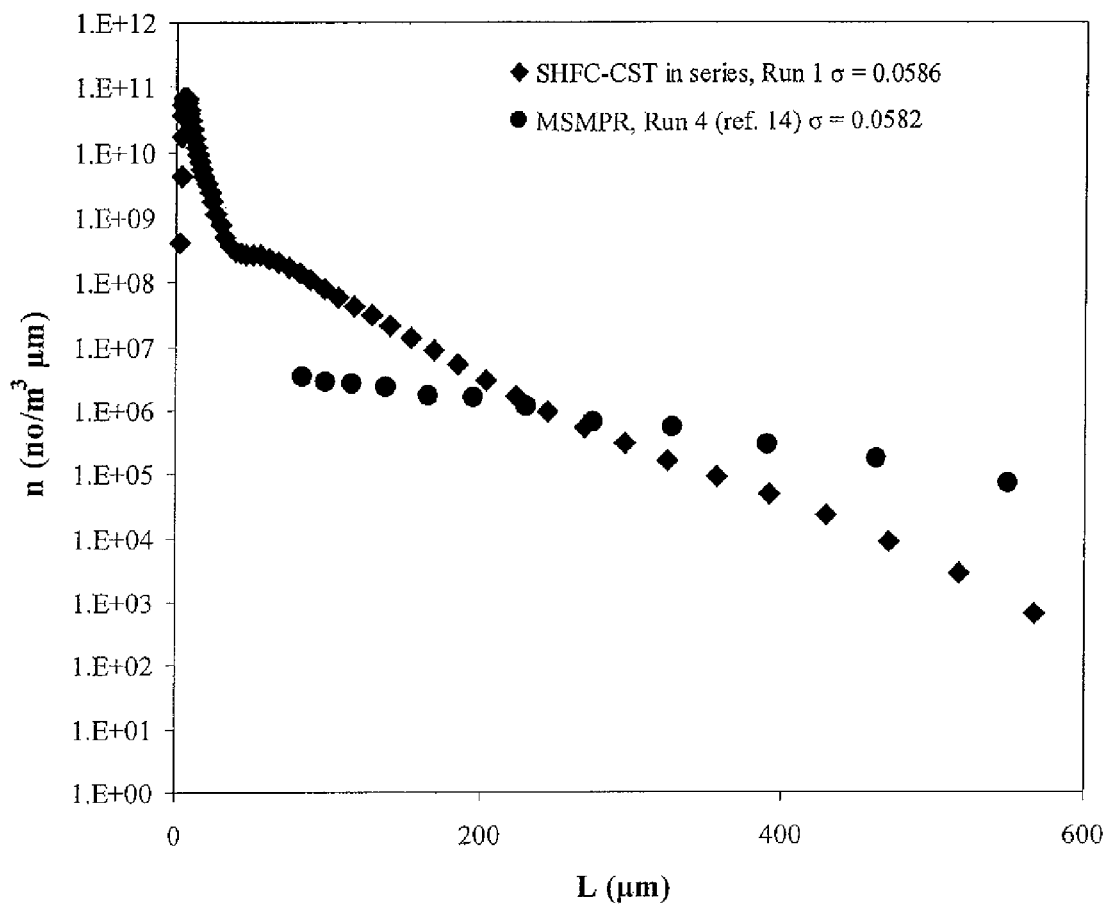
Figure 10. KNO₃ crystallization from aqueous solutions: Population density plot for a SHFC-CST in series run, for which the experimental magma density is in agreement with the value calculated by equation (7).

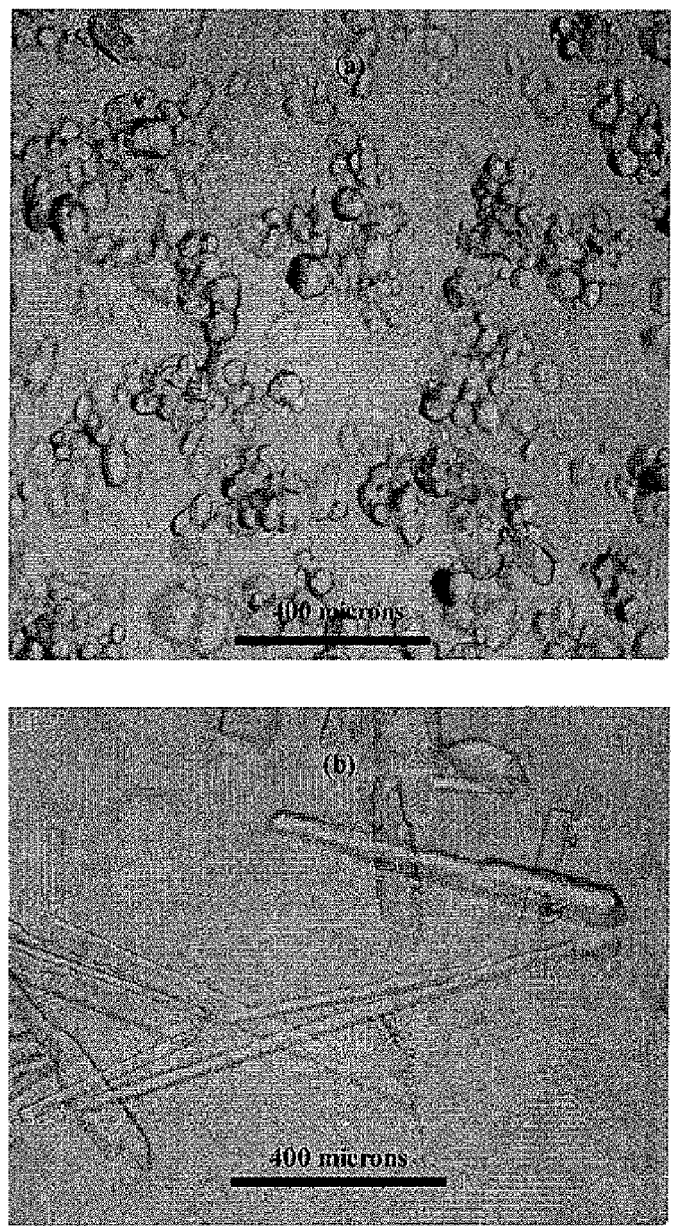
Figure 11. Crystal morphology obtained during KNO$_3$ solid hollow fiber cooling crystallization: (a) SHFC-CST in series operation mode; (b) SHFC once through operation mode.

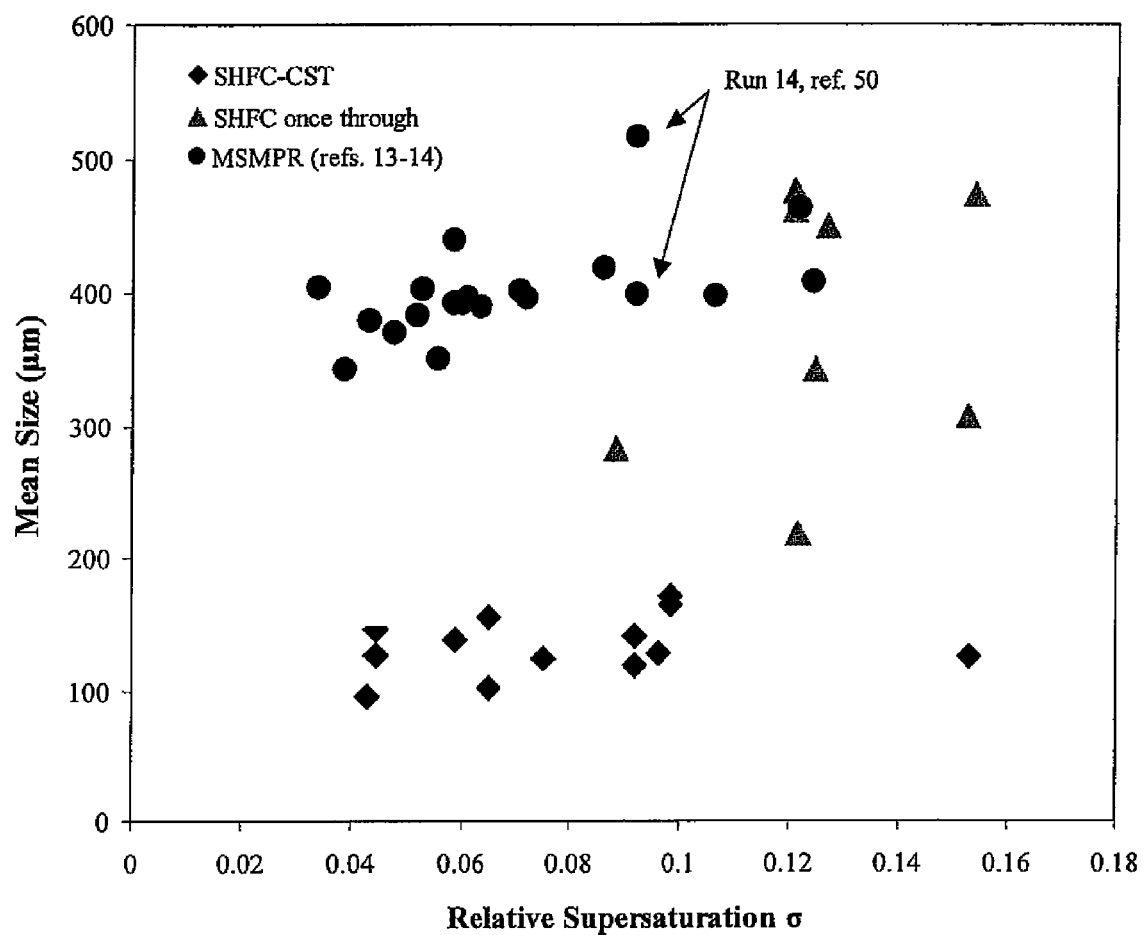
Figure 12. KNO$_3$ mean crystal size: Solid hollow fiber cooling crystallization vs. MSMPR data.

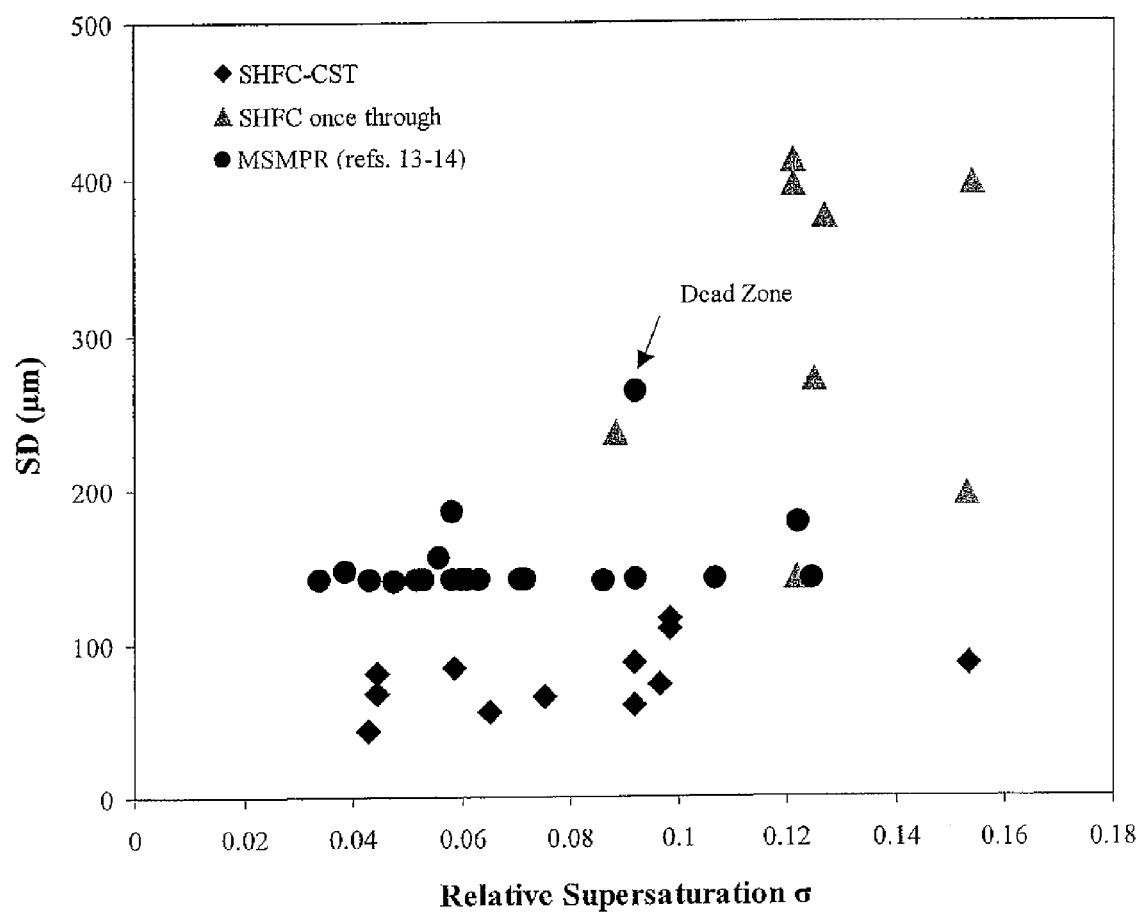
Figure 13. Standard deviation (SD) of the mean crystal size of $KNO_3$: Solid hollow fiber cooling crystallization vs. MSMPR data.

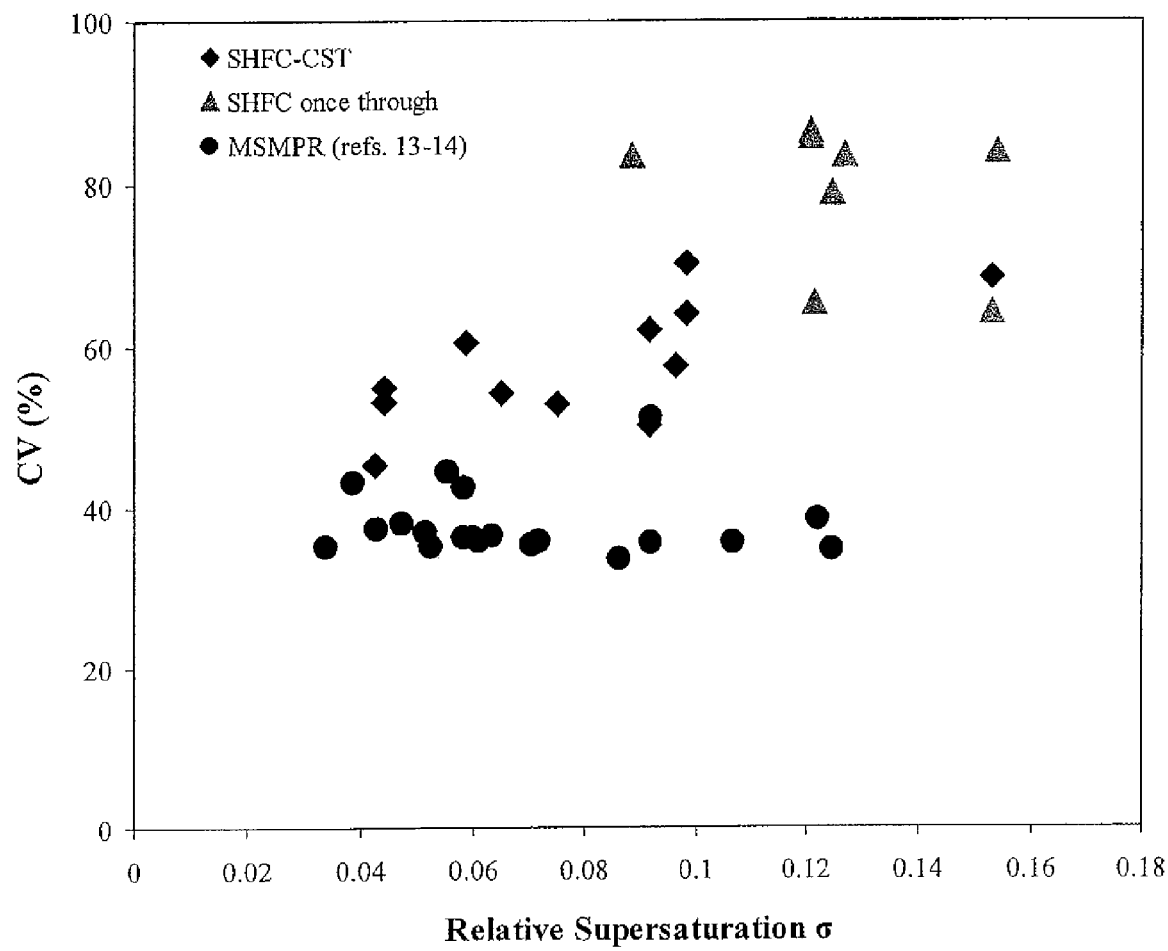
Figure 14. Coefficient of variation (CV) of $KNO_3$ crystal size distributions: Solid hollow fiber cooling crystallization vs. MSMPR data.

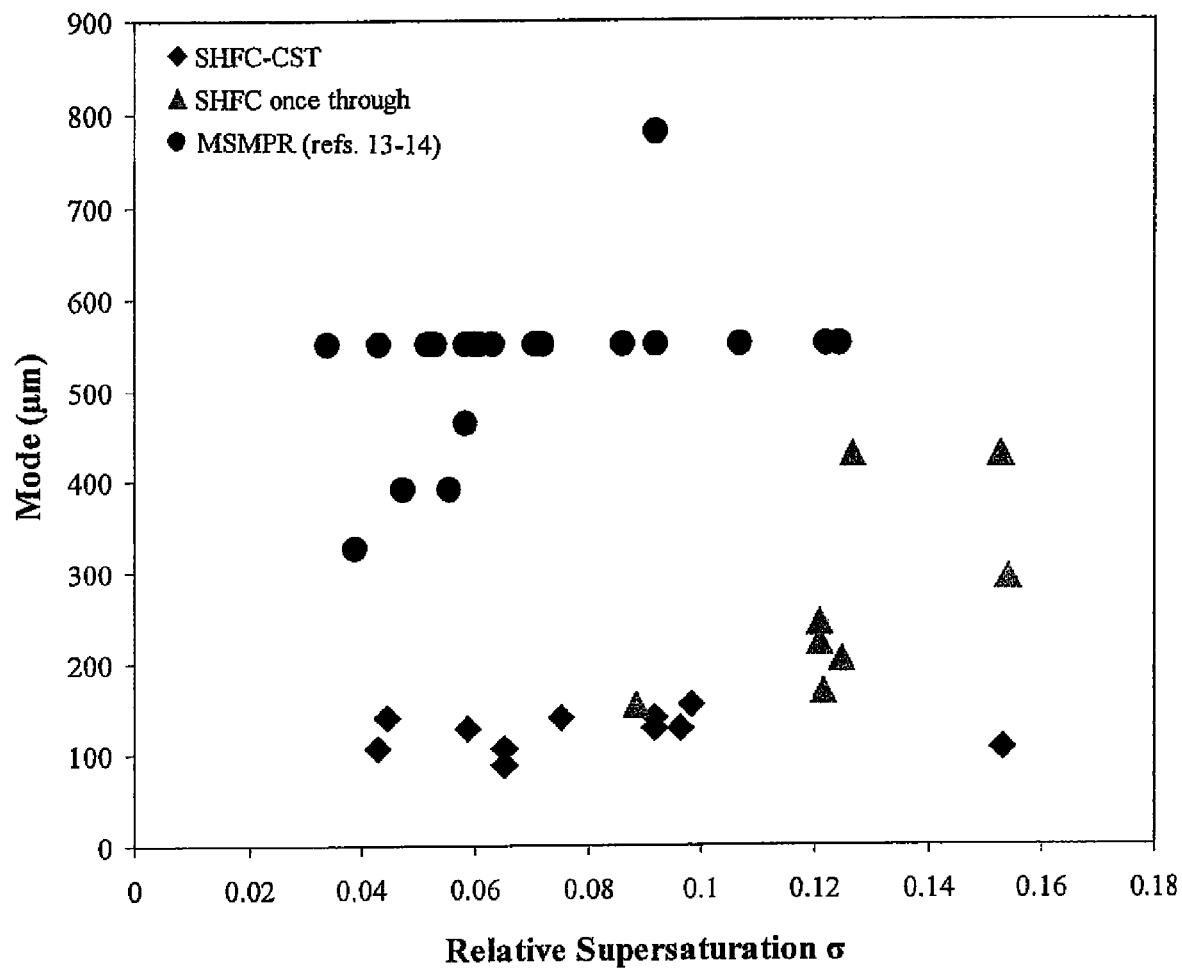
Figure 15. $KNO_3$ mode size: Solid hollow fiber cooling crystallization vs. MSMPR data.

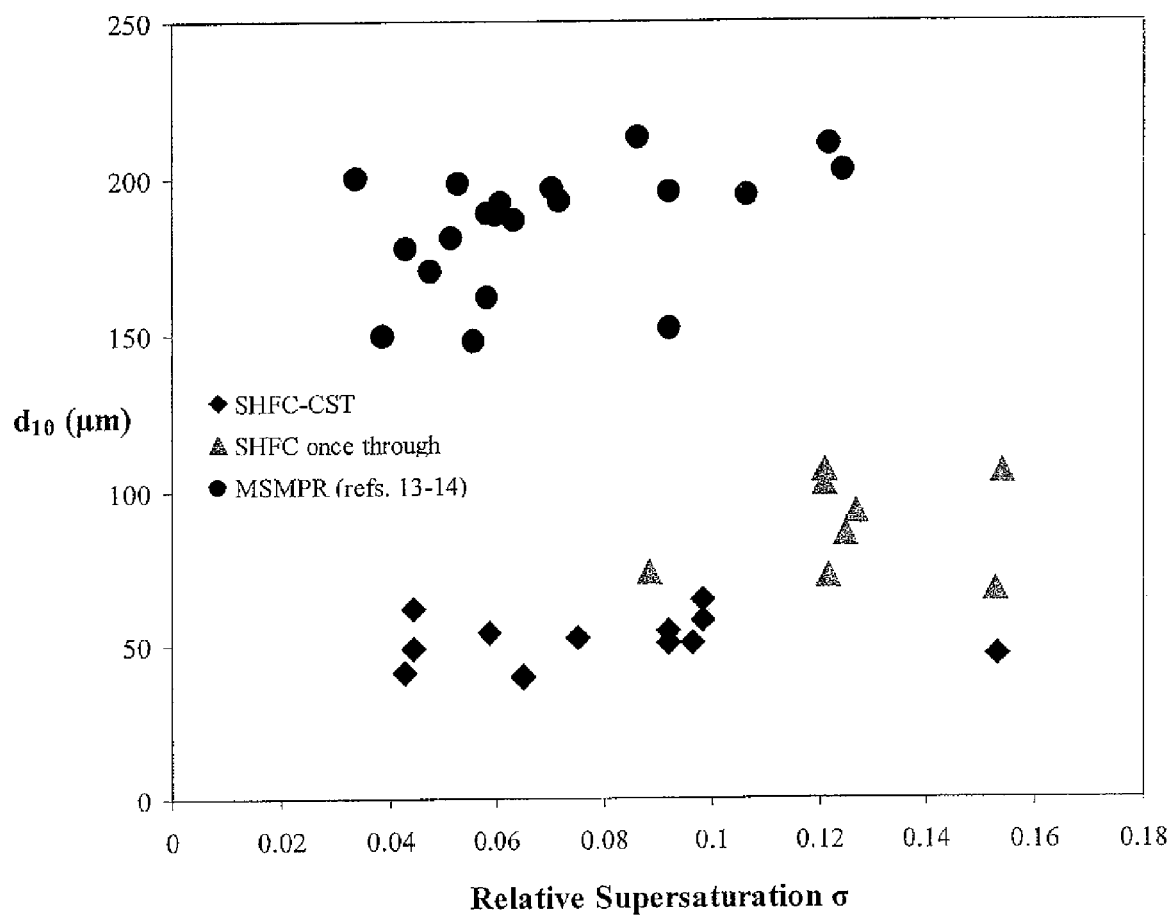
Figure 16. KNO$_3$ d$_{10}$ size: Solid hollow fiber cooling crystallization vs. MSMPR data.

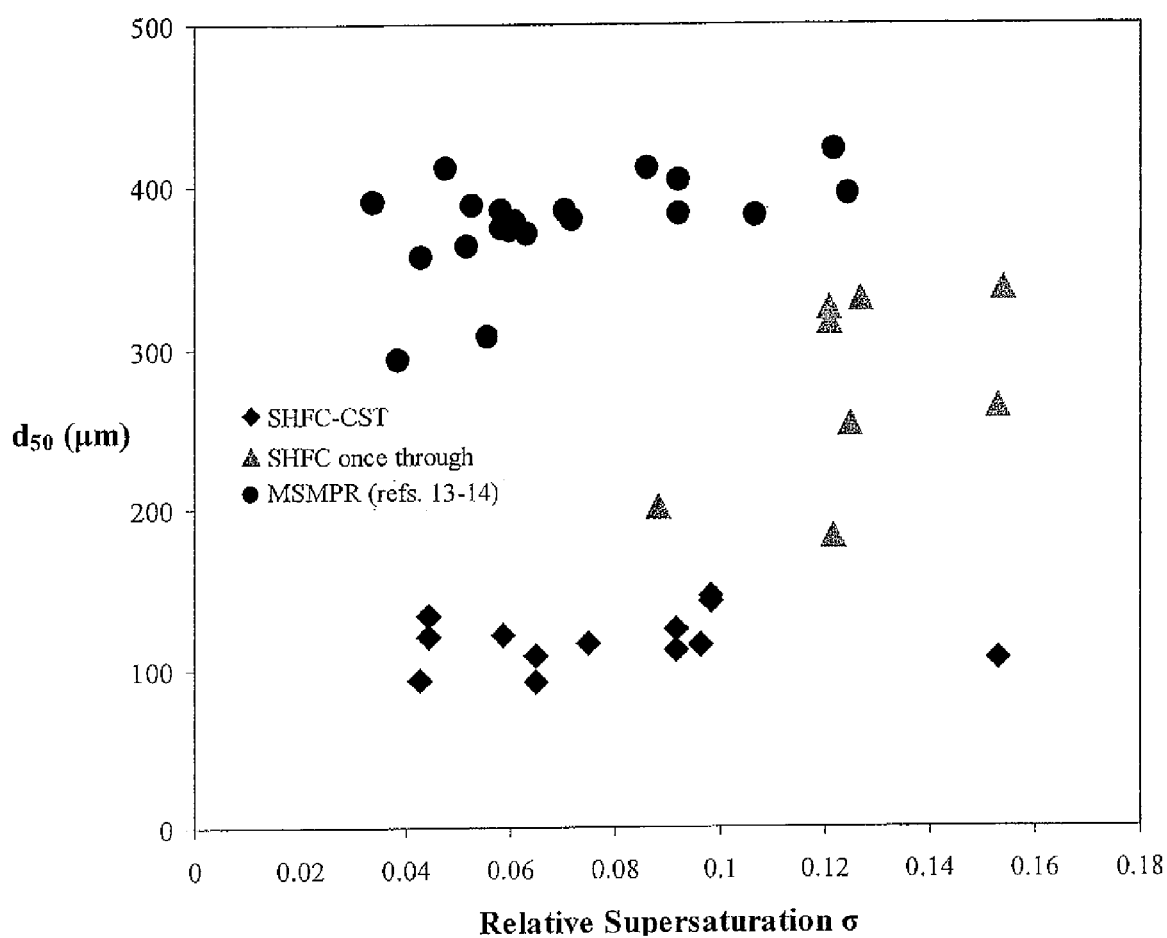
Figure 17. $KNO_3$ $d_{50}$ size: Solid hollow fiber cooling crystallization vs. MSMPR data.

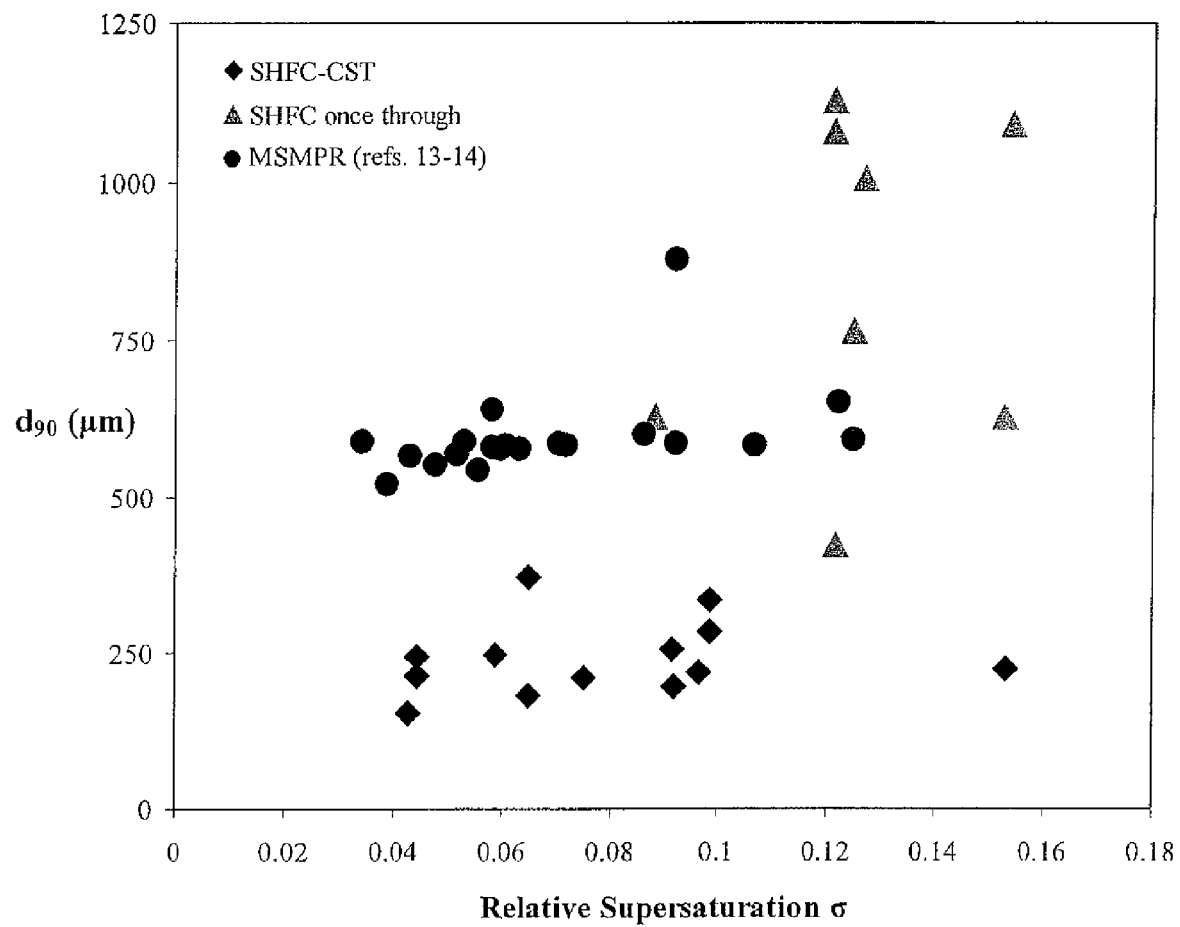
Figure 18. $KNO_3$ $d_{90}$ size: Solid hollow fiber cooling crystallization vs. MSMPR data.

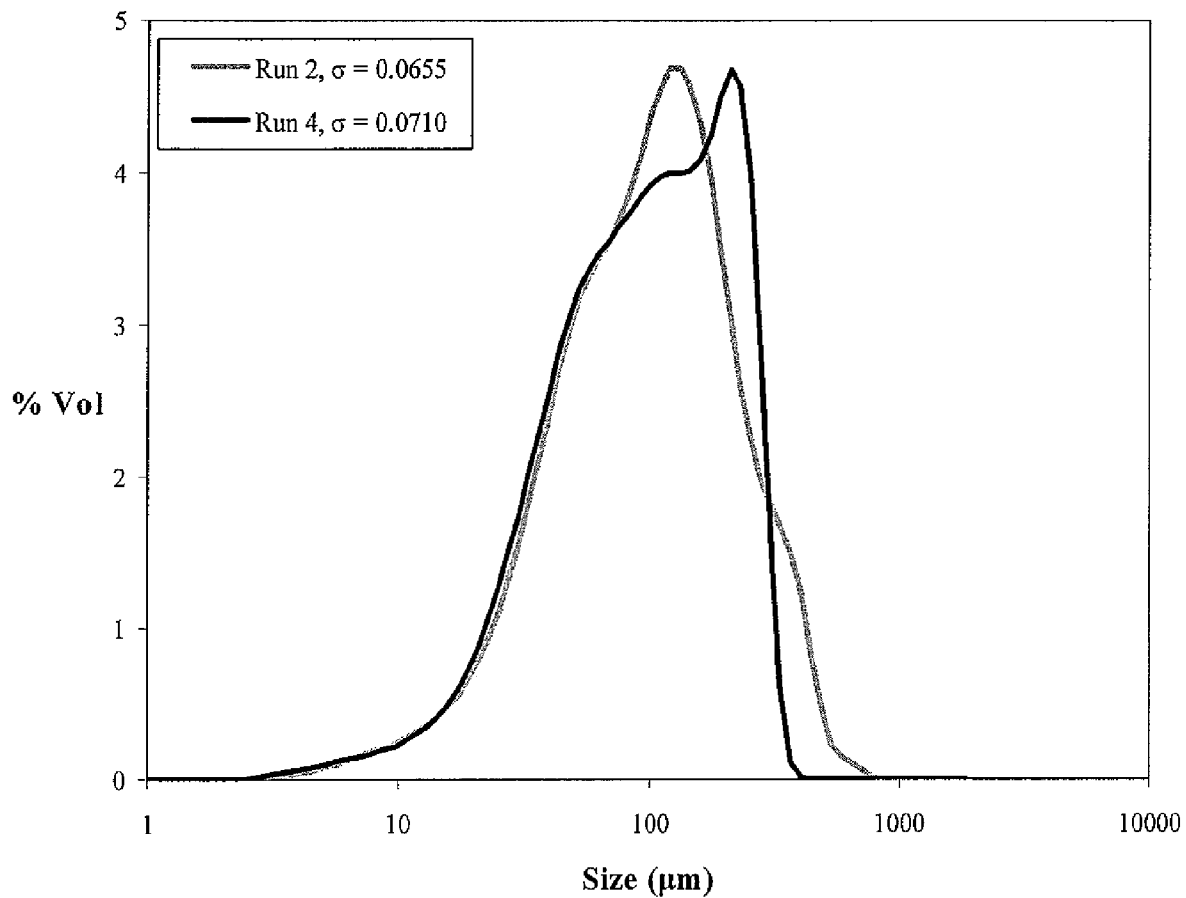
Figure 19. Salicylic acid crystallization from ethanol solutions: % Volume differential CSD for the SHFC-CST in series operation mode. Operating conditions: a) Run 2: $C_f = 0.534$ g/g, $T_{f,in} = 24.5°C$, $T_{f,out} = 16.0 °C$, $T^* = 20.4°C$, $\tau_{CST} = 120$ s; b) Run 4: $C_f = 0.536$ g/g, $T_{f,in} = 24.8°C$, $T_{f,out} = 15.9 °C$, $T^* = 20.7°C$, $\tau_{CST} = 120$ s.

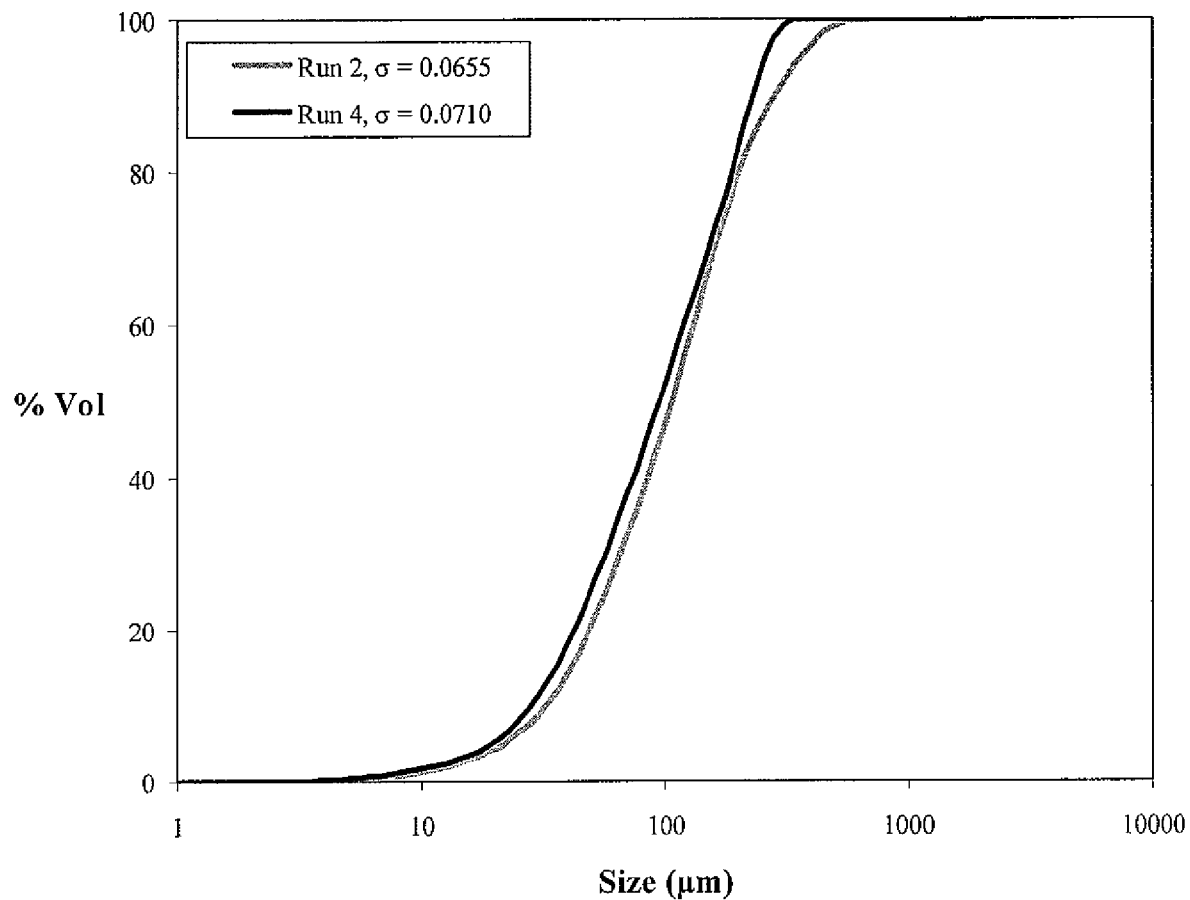
Figure 20. Salicylic acid crystallization from ethanol solutions: % Volume undersize cumulative CSD for the SHFC-CST in series operation mode. Operating conditions as in Figure 19.

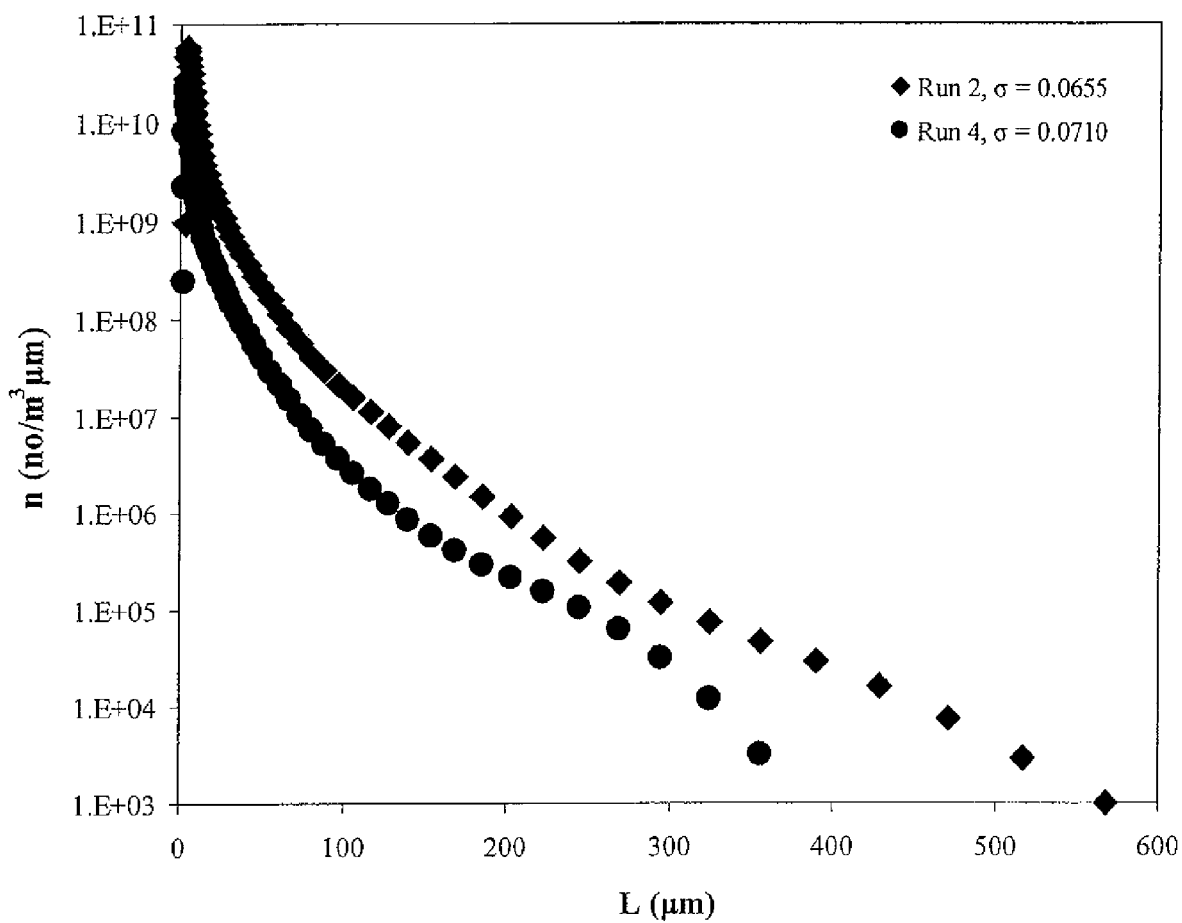
Figure 21. Salicylic acid crystallization from ethanol solutions: Population density curves. Operating conditions as in Figure 19.

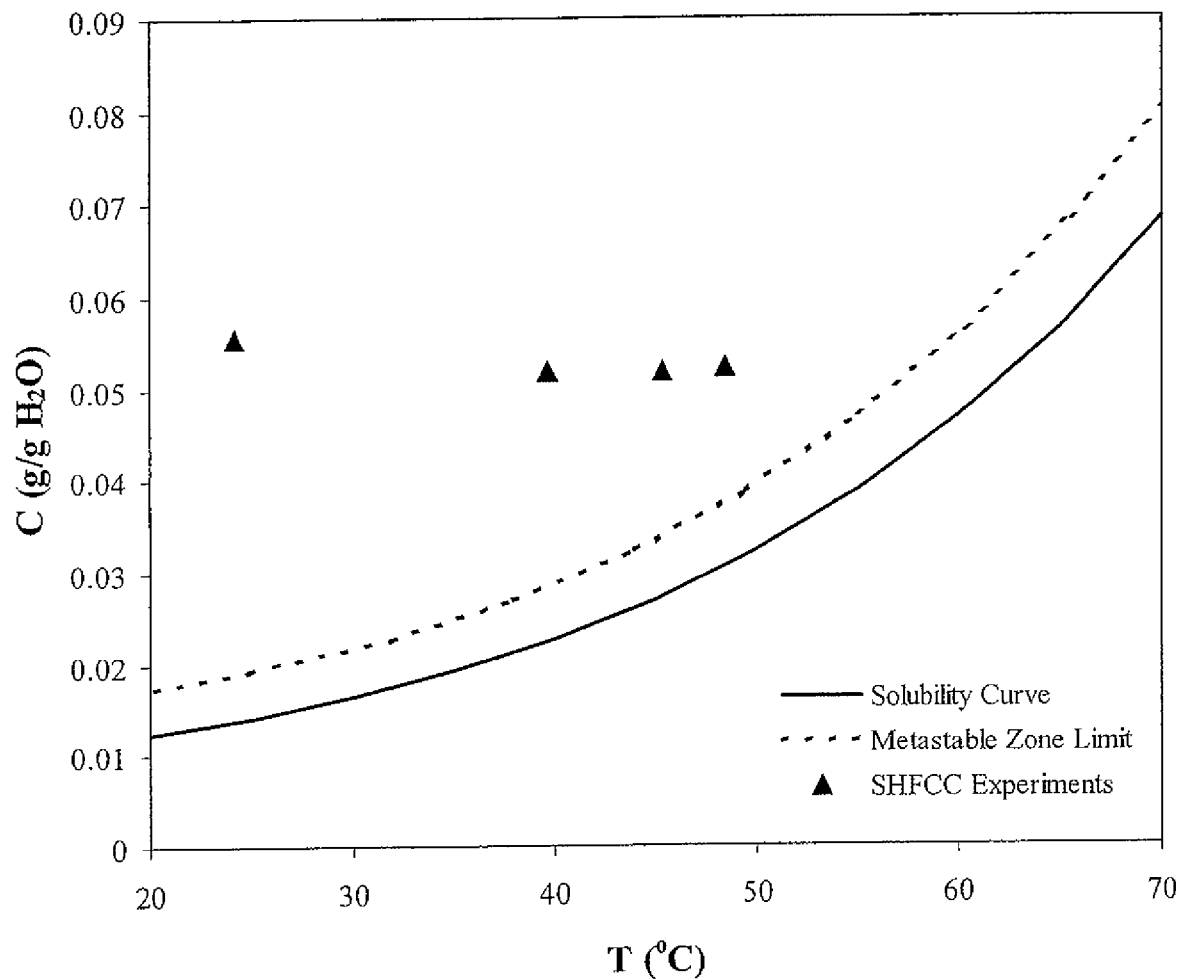
Figure 22. Operating conditions during the paracetamol runs in the SHFCC device.

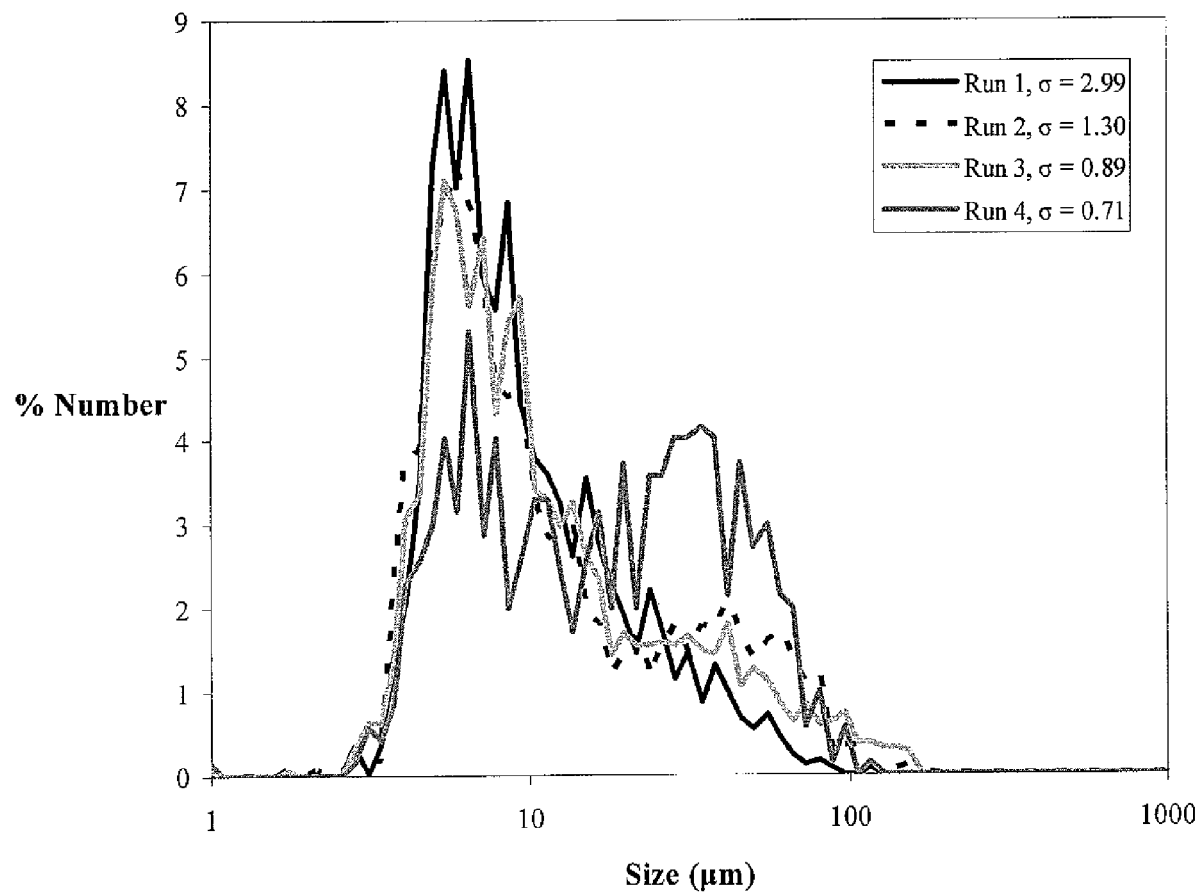
Figure 23. Paracetamol crystallization from aqueous solutions. % number differential CSD for SHFC-in-line static mixer in series operation. Mixed samples.

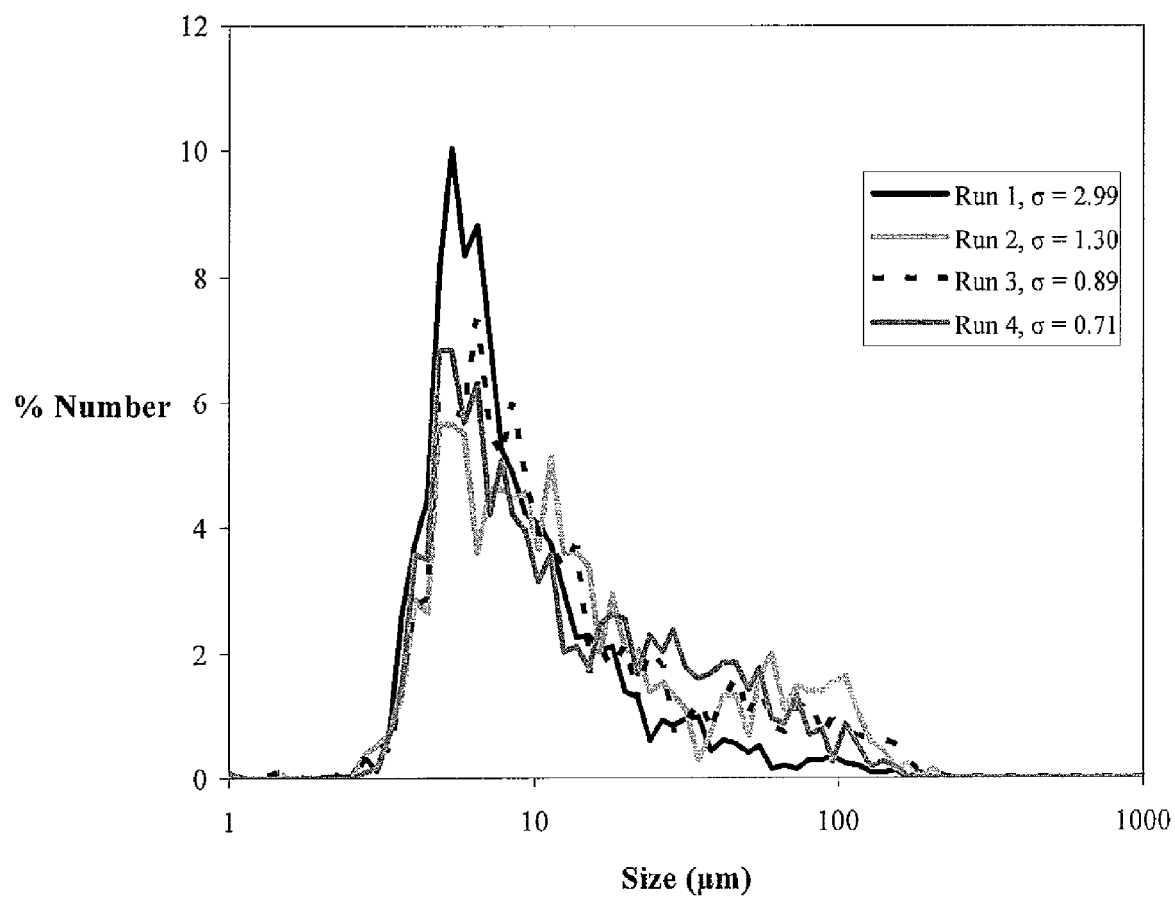
Figure 24. Paracetamol crystallization from aqueous solutions. % number differential CSD for SHFC-in-line static mixer in series operation. Unmixed samples.

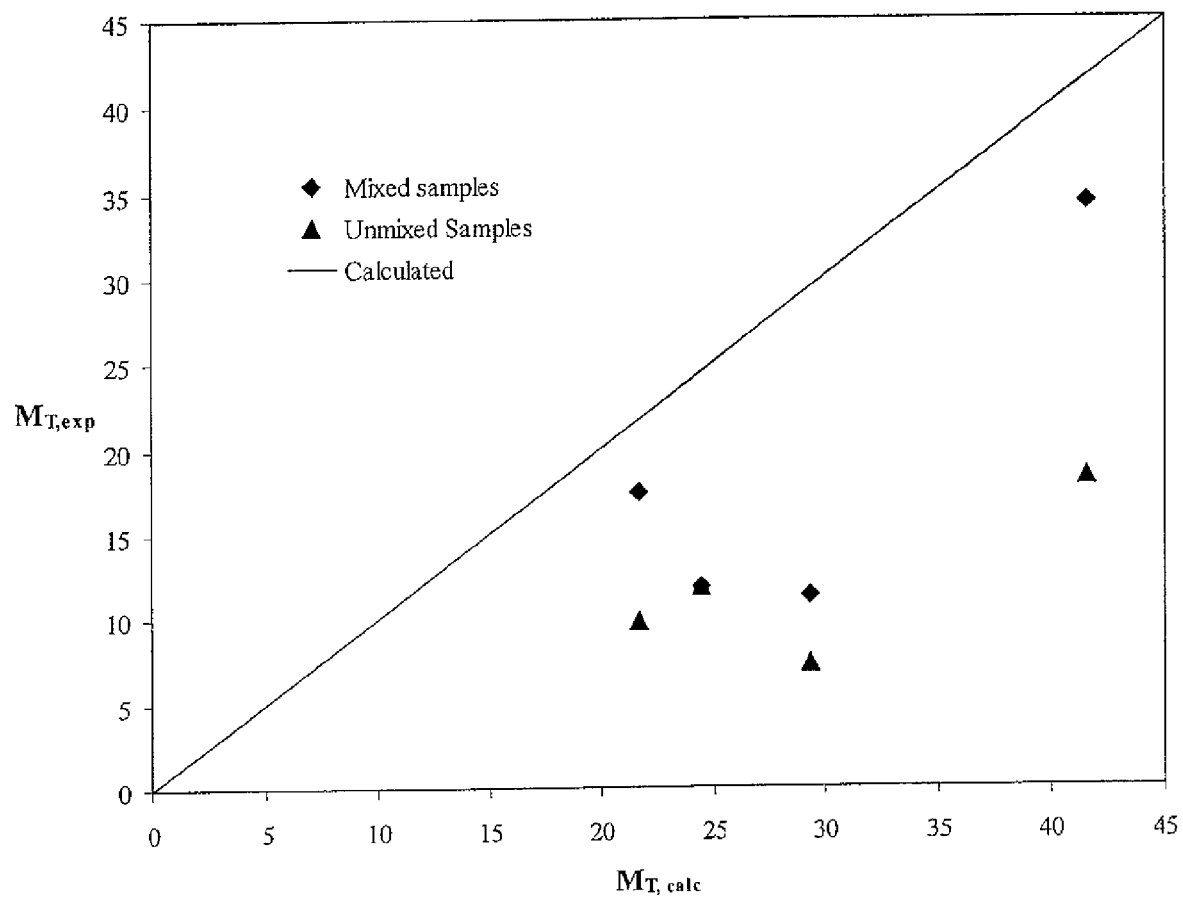
Figure 25. Paracetamol crystallization from aqueous solutions: Comparison of experimental and calculated magma density values.

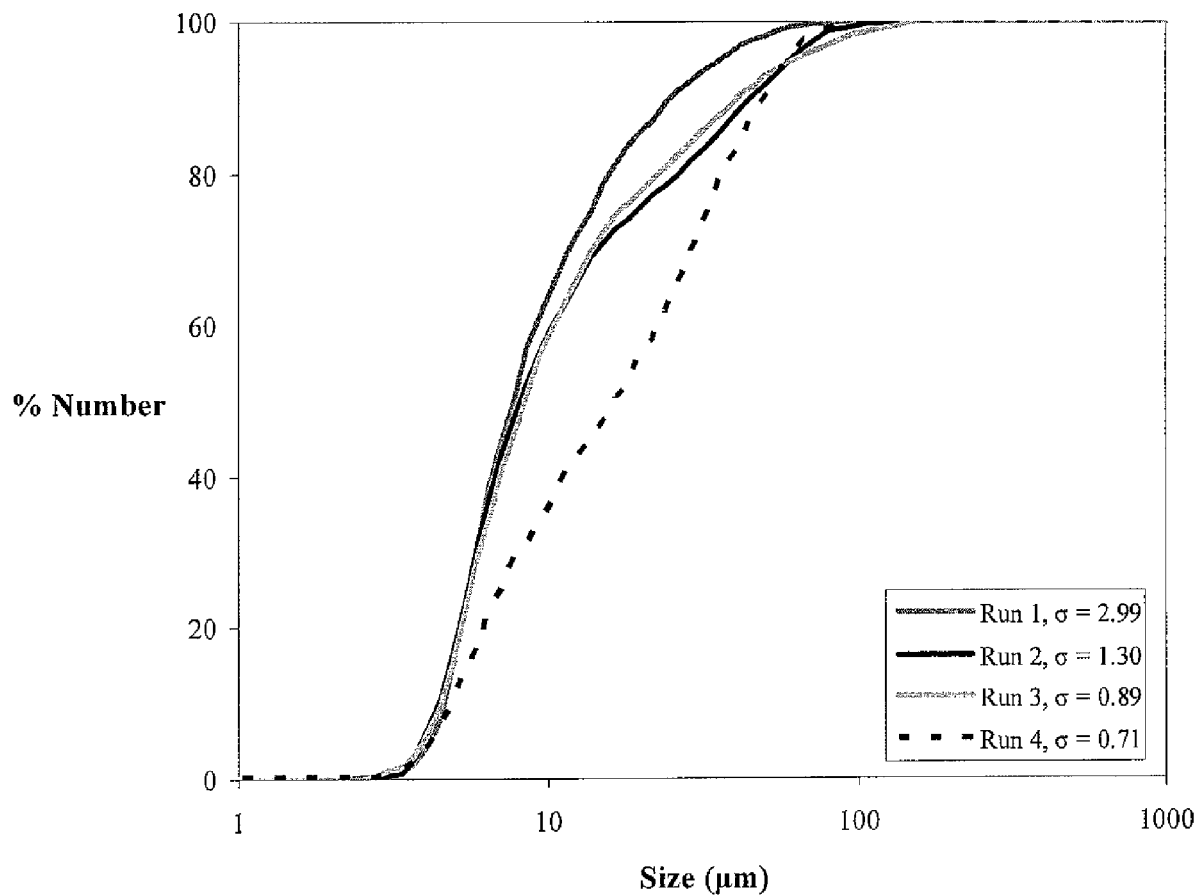
Figure 26. Paracetamol crystallization from aqueous solutions. % number cumulative undersize CSD for SHFC-in-line static mixer in series operation. Mixed samples.

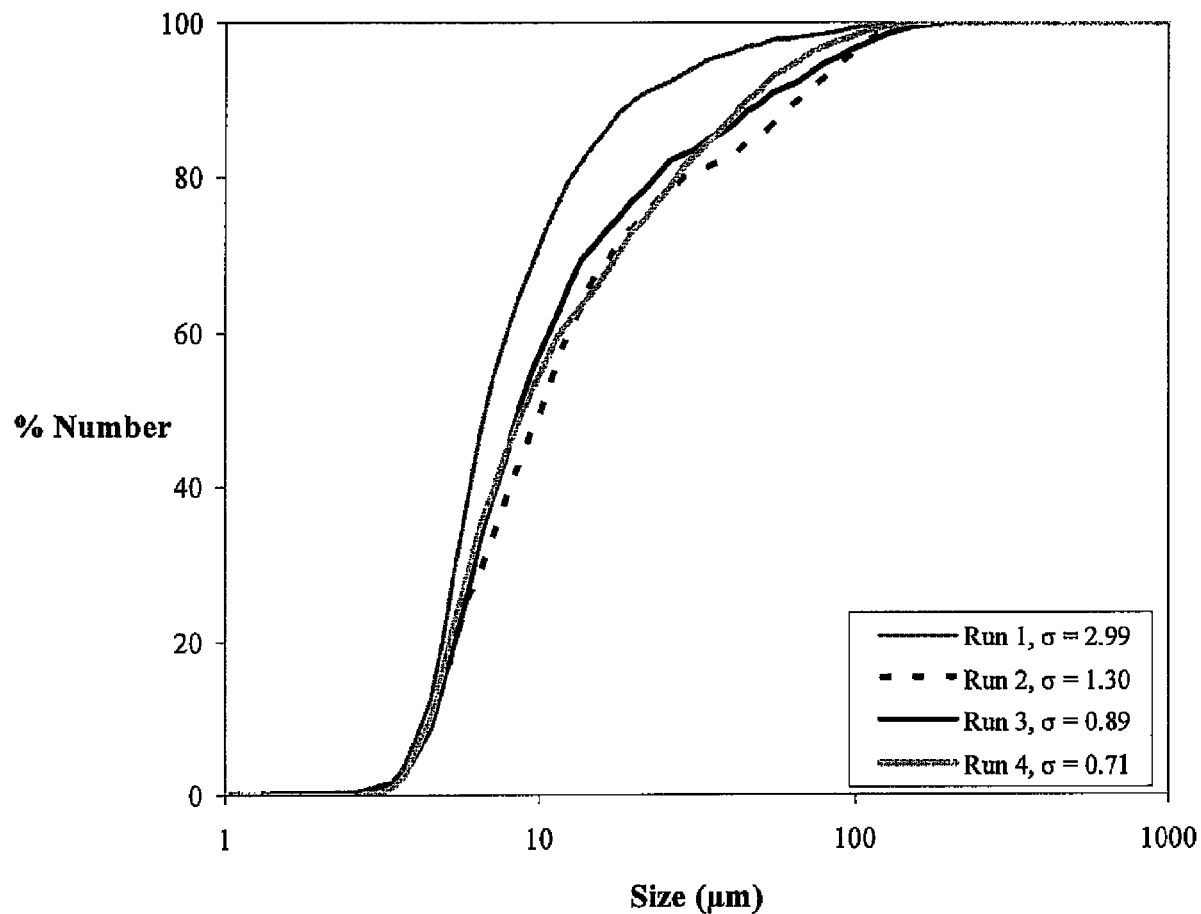
Figure 27. Paracetamol crystallization from aqueous solutions. % number cumulative undersize CSD for SHFC-in-line static mixer in series operation. Unmixed samples

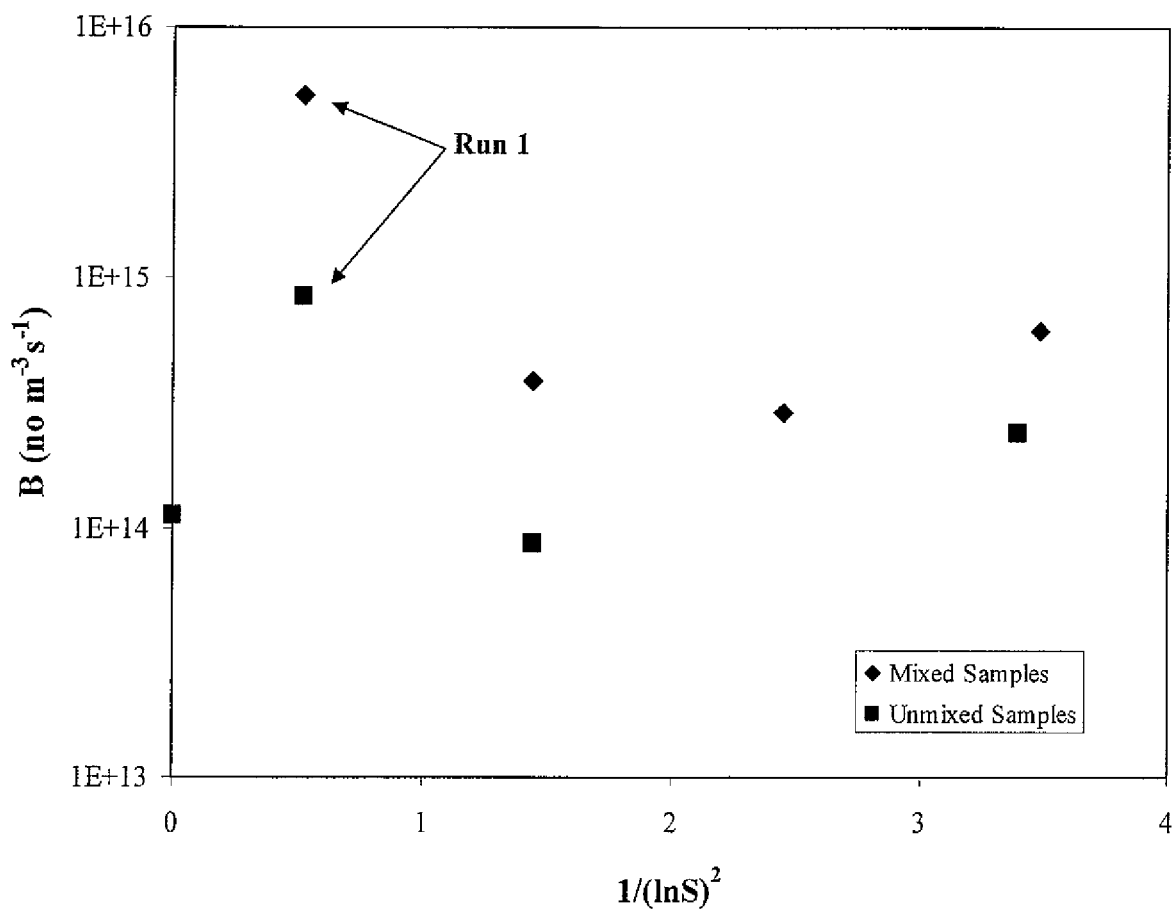
Figure 28. Paracetamol crystallization from aqueous solutions. Experimentally obtained nucleation rates.

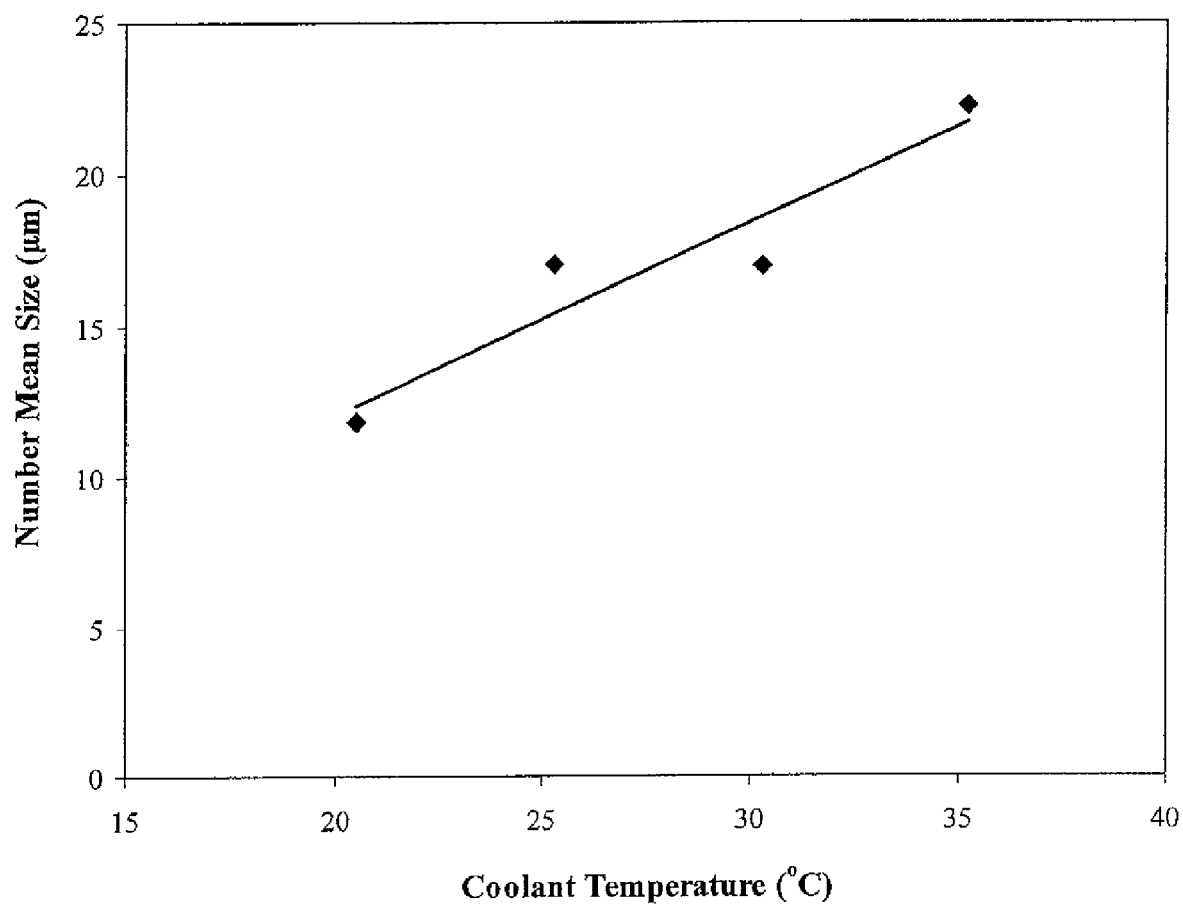
Figure 29. Paracetamol crystallization from aqueous solutions. Dependence of mean crystal size on coolant temperature.

SOLID HOLLOW FIBER COOLING CRYSTALLIZATION SYSTEMS AND METHODS

CROSS-REFERENCE TO RELATED APPLICATIONS

This patent application is a divisional application and claims the benefit of a commonly assigned, non-provisional U.S. patent application entitled "Solid Hollow Fiber Cooling Crystallization Systems and Methods," filed Oct. 26, 2005 and assigned Ser. No. 11/259,184 now abandoned, which non-provisional patent application claims priority to a co-pending, commonly assigned provisional application entitled "Solid Hollow Fiber Cooling Crystallizer and Method for Crystallizing Aqueous and Organic Solutions," which was filed on Nov. 8, 2004 and assigned Ser. No. 60/625,915. The entire content of the foregoing provisional patent application is incorporated herein by reference.

TECHNICAL FIELD

The present disclosure relates to the field of cooling crystallizers. It more particularly relates to cooling crystallizers yielding higher heat transfer area/volume ratio, less fouling, improved temperature control, higher nucleation rates, smaller crystals and/or narrower crystal size distributions. More particularly, the present disclosure relates to non-porous, hollow fiber devices for carrying out cooling crystallization of inorganic/organic microsolutes/macrosolutes from aqueous or organic solutions that include a solid hollow fiber crystallizer and an optional, completely stirred tank or in-line static mixer, wherein the solid hollow fiber crystallizer yields advantageous processing and/or crystal property attributes.

BACKGROUND ART

Crystallization and precipitation processes are known in the art, and are widely used in the chemical and pharmaceutical industries. Crystallization and precipitation processes are particularly prevalent in the pharmaceutical industry because over 90% of pharmaceutical products contain an active ingredient in particulate, generally crystalline, form. Properties of the crystallized product that are important include crystal size distribution (CSD), which generally should be as narrow as possible, and crystal shape/habit. These properties are determined by a variety of factors, such as crystallization technique employed, operating conditions, and choice of solvent.

Generally, there are four methods to induce crystallization: cooling, solvent removal, antisolvent addition, and chemical reaction (precipitation). The method of inducing crystallization generally dictates the type of process equipment utilized. Crystallization is generally carried out in stirred vessel devices, batch or continuous, in which perfect mixing of the slurry is presumed. One such type of continuous or batch type of stirred tank crystallizer is a Mixed Suspension Mixed Product Removal (MSMPR) crystallizer. MSMPR crystallizers are generally disadvantaged by poor mixing, fouling of heat transfer areas, small heat transfer area/volume ratio, and problems with scale-up. Furthermore, these conventional crystallization devices and methods are generally disadvantaged by not being able to meet the targets of a narrow CSD and a small mean crystal size due to imperfect mixing and non-uniform conditions inside the crystallizer. Conventional cooling crystallization devices are also disadvantaged by both nucleation and crystallization phenomena taking place simultaneously in the same vessel. In stirred vessels, continuous, batch or semi-batch, nucleation and growth occur in the same device, and therefore high supersaturation levels cannot be used due to severe incrustation of the cooling surfaces with a corresponding loss in performance.

In an effort to overcome these problems, two approaches have been investigated and/or undertaken. The first approach is to improve existing facilities by applying improved monitoring techniques that can lead to better prediction and control of the applied supersaturation, and hence better control of the final CSD. This approach is limited in performance because well-mixed crystallizers are intrinsically inclined towards a spectrum of local conditions in time and space, and consequently a relatively broad CSD.

The second approach is to develop new crystallization techniques where supersaturation can be created and depleted on a microscale, resulting in a narrow CSD and a small crystal size. The impinging-jet mixer technique is one such technique where two high velocity streams are brought into contact to effect high nucleation rates, followed by growth in a well-mixed vessel or a tubular precipitator. Other approaches that have been undertaken include emulsion crystallization, and precipitation with supercritical fluids.

Hollow fiber polymeric membrane devices have typically been used to prevent crystal formation. However, more recently, polymeric membranes have been used as a means of inducing crystallization and, in particular, as a means for producing crystals of a desired CSD and/or crystal shape through supersaturation creation and control. For example, reverse osmosis has been recognized as a crystallization technique involving solvent removal; however, reverse osmosis is disadvantaged by a high percentage of crystals remaining inside the reverse osmosis module resulting in fouling problems, pore blockage, a decrease in solvent flux, and generation of a supersaturation level with time. Reverse osmosis is also disadvantaged by the requirement of high operating pressures and the poor solvent resistance of reverse osmosis membranes.

Membrane distillation is another membrane technique involving solvent removal, but is also disadvantaged by fouling and pore blockage. Membrane distillation is also disadvantaged by a decrease in flux with increased feed concentration, and is generally suitable only for aqueous solutions due to wetting of the hydrophobic membrane pores by organic solvents.

Despite efforts to date, a need remains for cooling crystallizers that yield a higher heat transfer area/volume ratio, less fouling, improved temperature control, higher nucleation rates, smaller crystals and narrower crystal size distributions. These and other needs are advantageously satisfied by the systems, apparatus and methods disclosed herein.

SUMMARY OF THE DISCLOSURE

The present disclosure is directed to a solid hollow fiber crystallizer (SHFC) device/system for carrying out cooling crystallization of inorganic/organic microsolutes/macrosolutes from solution. Exemplary embodiments of the disclosed SHFC device/system include: (a) a shell or housing, and (b) a bundle of non-porous hollow fibers mounted within the shell or housing. The hollow fibers typically define a lumen side and a shell side, and are sized to accommodate flow of a feed solution through the respective lumena. A feed solution inlet opening is provided in the shell/housing for passing a feed solution into the lumena of the hollow fiber bundle, while a cooling solution inlet opening is provided in the shell/housing for passing a cooling solution into the shell/housing for heat transfer contact with the shell side of the hollow fibers. Outlet openings are also defined in the shell/housing for passage of the feed solution and the cooling fluid from the shell/housing, after crystallizing interaction has occurred within the shell/housing. The interaction between the feed solution and the cooling fluid within the shell/housing is advantageously adapted to form nuclei and, subsequently, crystals in the feed solution at a temperature below a feed solution saturation temperature. In further exemplary embodiments of the present disclosure, interaction between the feed solution and the cooling fluid within the shell/housing is advantageously adapted to grow crystals from seed crystals in the feed solution at a temperature below a feed solution saturation temperature A further aspect of the present disclosure is directed to solid hollow fiber crystallizer (SHFC) devices/systems for carrying out cooling crystallization of inorganic/organic microsolutes/macrosolutes from a solution, wherein the above-noted shell/housing is in fluid communication with a mixing device/apparatus downstream of the solid hollow fiber crystallizer. Thus, in exemplary embodiments of the present disclosure, the feed solution exits the shell/housing and is fed (in whole or in part) to a mixing device/apparatus. The mixing device/apparatus advantageously functions to further control crystal size distribution.

Another aspect of the present disclosure is directed to a method of forming nuclei and crystals in a feed solution of inorganic/organic microsolutes/macrosolutes of aqueous or organic solutions that includes the steps of: (a) conveying a feed solution into a lumen side of a solid hollow fiber crystallizer, (b) passing a chilled cooling solution into and out of a shell side of the solid hollow fiber crystallizer, (c) cooling the feed solution below its saturation temperature, and (d) conveying a cooled feed solution outside of the solid hollow fiber crystallizer. The cooled feed solution advantageously includes nuclei and crystals of inorganic and/or organic microsolutes and/or macrosolutes that are formed from the feed solution (which may be aqueous or organic). In further embodiments, the disclosed method forms/grows crystals from seed crystals that are present in the feed solution. The achieved crystallizations according to the disclosed method are advantageously characterized by a narrow CSD, high nucleation rates, and smaller crystal sizes.

In another aspect of the present disclosure, the feed solution containing the nuclei and crystals is conveyed from the disclosed solid hollow fiber crystallizer to a mixing device/apparatus. In exemplary embodiments of the present disclosure, the crystal size and distribution of the crystals/nuclei is further controlled within the mixing device/apparatus. Moreover, the crystals/nuclei may be advantageously filtered from the aqueous/organic solution in the mixer to recover the crystals/nuclei from the solution.

The systems and methods of the present disclosure offer many advantages. For example, one advantage of the present disclosure is that the disclosed solid hollow fiber cooling crystallizers exhibit at least ten (10) times higher heat transfer area/volume ratio, and up to 500-1000 times higher heat transfer area/volume ratio, as compared to conventional mixed suspension mixed product removal (MSMPR) cooling crystallizers.

Another advantage associated with the systems and methods of the present disclosure is that, in certain implementations, the disclosed solid hollow fiber cooling crystallizers exhibit less fouling than conventional mixed suspension mixed product removal (MSMPR) cooling crystallizers.

A further advantage associated with the systems and methods of the present disclosure is that the disclosed solid hollow fiber cooling crystallizers exhibit nucleation rates that are two (2) to three (3) times higher than conventional mixed suspension mixed product removal (MSMPR) cooling crystallizers.

A further advantage associated with the systems and methods of the present disclosure is that the disclosed solid hollow fiber cooling crystallizers yield crystals that are three (3) to four (4) times smaller than conventional mixed suspension mixed product removal (MSMPR) cooling crystallizers.

A further advantage associated with the systems and methods of the present disclosure is that the disclosed solid hollow fiber cooling crystallizers yield a narrower crystal size distribution than conventional mixed suspension mixed product removal (MSMPR) cooling crystallizers.

A further advantage associated with the systems and methods of the present disclosure is that the disclosed solid hollow fiber cooling crystallizers exhibit temperature control performance levels approaching as low as 1° C., which is lower than conventional mixed suspension mixed product removal (MSMPR) cooling crystallizers.

A further advantage associated with the systems and methods of the present disclosure is that feed solution for crystallization may be fed through either the lumen side or the shell side of the solid hollow fiber device/system, thereby enhancing the flexibility and applicability of the disclosed device/system.

A further advantage associated with the systems and methods of the present disclosure is that the disclosed solid hollow fiber cooling crystallizers yield high cooling rates that permit or facilitate effective decoupling of crystal nucleation and crystal growth phenomena and control polymorph formation.

These and other advantages, features and attributes of the disclosed solid hollow fiber cooling crystallization systems and methods will be apparent from the detailed description which follows, particularly when read in conjunction with the figures appended hereto.

BRIEF DESCRIPTION OF THE FIGURES

To assist those of ordinary skill in making and using the disclosed devices, systems and methods, reference is made to the accompanying figures, wherein:

FIG. 1 depicts a schematic flow diagram of a solid hollow fiber cooling crystallizer design according to the present disclosure.

FIG. 2 depicts a schematic flow diagram of an exemplary set-up for solid hollow fiber cooling crystallization according to the present disclosure.

FIG. 3 is a plot of % volume differential CSD for $KNO_3$ crystallization from aqueous solution for an exemplary solid hollow fiber crystallizer (SHFC) and completely stirred tank (CST) system in series operation mode (SHFC-CST) based on a pair of runs according to the present disclosure, as compared to a conventional MSMPR crystallizer.

FIG. 4 is a plot of % volume cumulative undersize CSD for $KNO_3$ crystallization from aqueous solution for an exemplary SHFC-CST system in series operation mode based on a pair of runs according to the present disclosure, as compared to a conventional MSMPR crystallizer.

FIG. 5 is a plot of % volume differential CSD for $KNO_3$ crystallization from aqueous solution for an exemplary SHFC system (once through operation mode) based on a pair of runs according to the present disclosure, as compared to a conventional MSMPR crystallizer.

FIG. 6 is a plot of % volume cumulative undersize CSD for $KNO_3$ crystallization from aqueous solutions for an exemplary SHFC (once through operation mode) based on a pair of runs according to the present disclosure, as compared to a conventional MSMPR crystallizer.

FIGS. 7a and 7b depict population density curves for the data presented in FIGS. 3 and 5 for the SHFC-CST in series and SHFC once through operation modes, respectively, according to the present disclosure, as compared to a conventional MSMPR crystallizer.

FIG. 8 is a plot of the number of crystals generated per unit volume for $KNO_3$ crystallization from aqueous solutions for exemplary SHFC-CST in series and SHFC once through operation modes according to the present disclosure, as compared to a conventional MSMPR crystallizer.

FIG. 9 is a plot of experimental magma density values for $KNO_3$ crystallization from aqueous solutions for exemplary SHFC-CST in series and SHFC once through operation modes according to the present disclosure in comparison to calculated values.

FIG. 10 is a plot of the population density values for $KNO_3$ crystallization from aqueous solutions for the SHFC-CST in series operation modes according to the present disclosure, as compared to a conventional MSMPR crystallizer.

FIGS. 11a and 11b depict exemplary microscopic crystal morphology for $KNO_3$ crystallization from aqueous solutions for SHFC-CST in series and SHFC once through operation modes, respectively, according to the present disclosure.

FIG. 12 is a plot of mean crystal size versus relative supersaturation for $KNO_3$ crystallization from aqueous solutions for the SHFC-CST in series and SHFC once through operation modes according to the present disclosure, as compared to a conventional MSMPR crystallizer.

FIG. 13 is a plot of the standard deviation of the mean crystal size versus relative supersaturation for $KNO_3$ crystallization from aqueous solutions for the SHFC-CST in series and SHFC once through operation modes in comparison to a MSMPR crystallizer.

FIG. 14 is a plot of the coefficient of variation (CV) of crystal size distribution versus relative supersaturation for $KNO_3$ crystallization from aqueous solutions for exemplary SHFC-CST in series and SHFC once through operation modes according to the present disclosure, as compared to a conventional MSMPR crystallizer.

FIG. 15 is a plot of mode size versus relative supersaturation for $KNO_3$ crystallization from aqueous solutions for exemplary SHFC-CST in series and SHFC once through operation modes according to the present disclosure, as compared to a conventional MSMPR crystallizer.

FIG. 16 is a plot of $d_{10}$ size versus relative supersaturation for $KNO_3$ crystallization from aqueous solutions for exemplary SHFC-CST in series and SHFC once through operation modes according to the present disclosure, as compared to a conventional MSMPR crystallizer.

FIG. 17 is a plot of $d_{50}$ size versus relative supersaturation for $KNO_3$ crystallization from aqueous solutions for exemplary SHFC-CST in series and SHFC once through operation modes according to the present disclosure, as compared to a conventional MSMPR crystallizer.

FIG. 18 is a plot of $d_{90}$ size versus relative supersaturation for $KNO_3$ crystallization from aqueous solutions for exemplary SHFC-CST in series and SHFC once through operation modes according to the present disclosure, as compared to a conventional MSMPR crystallizer.

FIG. 19 is a plot of % volume differential CSD for an exemplary salicyclic acid crystallization from ethanol solutions for SHFC-CST in series operation mode according to the present disclosure.

FIG. 20 is a plot of % volume undersize cumulative CSD for exemplary salicyclic acid crystallization from ethanol solutions for SHFC-CST in series operation mode according to the present disclosure.

FIG. 21 is a plot of exemplary population density values for salicyclic acid crystallization from ethanol solutions for SHFC-CST in series operation mode according to the present disclosure.

FIG. 22 is a plot of concentration versus temperature for exemplary paracetamol crystallizations from aqueous solutions in a SHFC device/system according to the present disclosure.

FIG. 23 is a plot of CSD for exemplary paracetamol crystallizations from aqueous solutions in connection with SHFC in-line static mixer in series operations for mixed samples according to the present disclosure.

FIG. 24 is a plot of CSD for exemplary paracetamol crystallizations from aqueous solutions for SHFC in-line static mixer in series operation for unmixed samples according to the present disclosure.

FIG. 25 is a plot of experimental magma density values and calculated thermodynamic limits for paracetamol crystallization from aqueous solutions.

FIG. 26 is a plot of undersize CSD for exemplary paracetamol crystallizations from aqueous solutions for SHFC in-line static mixer in series operation for mixed samples.

FIG. 27 is a plot of % number cumulative undersize CSD for exemplary paracetamol crystallizations from aqueous solutions for SHFC in-line static mixer in series operation for unmixed samples.

FIG. 28 is a plot of nucleation rates for exemplary paracetamol crystallization from aqueous solutions for mixed and unmixed sample systems according to the present disclosure.

FIG. 29 is a plot of number mean crystal size versus coolant temperature for paracetamol crystallization from aqueous solutions according to the present disclosure.

DETAILED DESCRIPTION OF EXEMPLARY EMBODIMENT(S)

Solid hollow fiber cooling crystallizer (SHFC) devices/systems of the present disclosure and associated crystallization methods offer significant advantages relative to prior art systems/methods. The disclosed SHFC devices/systems generally include a bundle of non-porous, symmetric hollow fibers mounted within a shell, wherein an aqueous or organic feed solution for crystallization travels through the lumen side of the fiber bundle and a cooling solution travels through the shell side of the fiber bundle to effectuate the formation of nuclei and, subsequently, crystals in the feed solution at a temperature below its saturation temperature. In alternative embodiments of the present disclosure, the disclosed SHFC devices/systems generally include a bundle of non-porous, asymmetric hollow fibers with a non-porous skin on the fiber's inner diameter (ID) mounted within a shell, wherein an aqueous or organic feed solution for crystallization travels through the lumen side of the fiber bundle and a cooling solution travels through the shell side of the fiber bundle to effectuate the formation of nuclei and, subsequently, crystals in the feed solution at a temperature below its saturation temperature. As compared to prior systems and methods, the solid hollow fiber cooling crystallizer and crystallization methods of the present disclosure yield higher heat transfer area/volume ratio, less fouling, improved temperature control, higher nucleation rates, smaller crystals and narrower crystal size distributions in exemplary implementations thereof.

FIG. 1 depicts a schematic flow diagram that encapsulates the general operating principle of the disclosed solid hollow fiber cooling crystallization systems and methods. According to exemplary embodiments of the present disclosure, a solid hollow fiber crystallizer device 10 includes a bundle of non-porous, symmetric polymeric or ceramic hollow fibers (or non-porous asymmetric polymeric or ceramic hollow fibers with a non-porous skin on the fiber's ID) 12 mounted in a shell (not shown) with inlet and outlet openings (not shown) for transporting feed solution or liquid 14 and cooling solution or liquid 16 through the lumen side 18 and shell side 20 of the fiber bundle, respectively. Typically, the feed solution 14 to be crystallized is fed through the lumen side 18 of the hollow fiber bundle, while a suitable cooling solution 16 is circulated in countercurrent, cocurrent or crossflow mode through the shell side 20 of the device 10. In such an arrangement, the feed solution 14 is subdivided into numerous fluid packets by traveling through each hollow fiber 12 with the same velocity and under the same cooling conditions. If cooling of the feed solution 14 proceeds below its feed saturation temperature, crystallization takes place in each fiber 12 under the same conditions, resulting in an advantageously narrow crystal size distribution.

Alternatively, the shell side of the disclosed solid hollow fiber crystallizer may be used for passing the feed solution and the lumen side of the solid hollow fiber crystallizer may be used for passing cooling solution, such that crystallization occurs on the shell side of the solid hollow fiber crystallizer.

The disclosed solid hollow fiber crystallizer (SHFC) is also optionally combined with a downstream mixing device for further controlling crystal size distribution of the feed solution after nuclei and crystals are formed within the solid hollow fiber cooling crystallizer. A completely stirred tank (CST) and an in-line static mixer are exemplary downstream mixing devices according to the present disclosure, although alternative downstream unit operations may be employed without departing from the spirit or scope of the present disclosure.

The fiber bundles associated with the disclosed solid hollow fiber crystallizer devices/systems are generally characterized by a large surface area/volume ratio. The surface area/volume ratio is determined/defined by the outside fiber diameter and packing density. Suitable exemplary hollow fibers may have an outside diameter of about 0.6 mm, and a packing fraction of about 20% to yield a surface area/volume ratio of about 1300 $m^2/m^3$. Moreover, the surface area/volume ratio of commercially-scaled membrane contactors may reach up to 4000 $m^2/m^3$. Similar surface area/volume ratio values may be achieved with the solid hollow fibers of the present disclosure. These surface area/volume ratios exceed the values typically encountered in cooling equipment utilized in conventional crystallizers. For comparison, a typical shell and tube heat exchanger with ¾ inch tubes in a 1 inch triangular pitch has a surface area/volume ratio of about 100 $m^2/m^3$, and for 0.5 inch tubes, the surface area/volume ratio is about 314 $m^2/m^3$. For jacketed vessels, the comparison is even more favorable because a vessel of 2 ft diameter may have a surface to volume ratio of only about 7 $m^2/m^3$.

The large surface/volume ratio afforded by the disclosed hollow fiber cooling crystallization devices yields a number of distinct advantages relative to conventional cooling crystallizers. One advantage is improved heat transfer between the feed solution traveling through the lumen side and the cooling solution traveling through the shell side of the crystallizer, resulting in tighter control of the temperature profile of the crystallizing solution. In particular, hollow fiber devices according to the present disclosure may transfer 3-10 times more heat on a volumetric basis than conventional shell and tube heat exchangers for both aqueous and organic streams. The improved heat transfer achieved with the disclosed solid hollow fiber cooling crystallization systems/methods in turn results in high cooling rates, which can be effectively utilized to decouple crystal nucleation and crystal growth. Decoupling of crystal nucleation and crystal growth is not possible in conventional cooling crystallization equipment where both nucleation and crystallization phenomena take place simultaneously in the same vessel.

A second advantage of a large surface/volume ratio for a hollow fiber device of the type disclosed herein is reduced impact of fouling on the heat transfer performance because of the large amount of heat transfer area available to compensate for any local losses. In addition, the hollow fiber wall heat transfer resistance may be tailored to avoid excessive temperature differences between the fiber wall and the crystallizing feed solution. In particular, a temperature differential between the inside and outside of the hollow fiber wall of as low as about 1-2° C. may be obtained with solid hollow fiber crystallization devices according to the present disclosure.

A third advantage of a large surface/volume ratio for a hollow fiber device of the type disclosed herein is improved scale-up to larger diameter devices because of the minimal increase in the temperature differential across the hollow fiber wall as surface area to volume ratio decreases. In comparison, a temperature difference of about 5-10° C. may be encountered in shell and tube heat exchangers used in conjunction with forced circulation crystallizers.

A fourth advantage of a large surface/volume ratio for the disclosed hollow fiber crystallizer devices/systems is higher nucleation rates compared to conventional crystallizers of the same volume. In distinct contrast, less precise temperature control and high temperature C differentials encountered with conventional crystallizers may lead to uncontrolled nucleation and poor control of crystal size and distribution.

The hollow fibers used in the disclosed solid hollow fiber crystallizer devices/systems may be fabricated from materials that include, but are not limited to, polymeric or ceramic materials. Selection of appropriate hollow fiber material(s) is generally based on the process requirements associated with system parameters and characteristics. Polymeric materials are known to be inert to aqueous and many organic solvents, thus making SHFC devices utilizing polymeric hollow fibers suitable for both aqueous and organic feeds. Solid hollow fibers according to the present disclosure are generally non-porous, and may be symmetric or asymmetric with a non-porous skin on the ID thereof. In addition, the disclosed solid hollow fibers may have a smooth surface to minimize the possibility of fiber rupture by crystals. Coated hollow fibers may also be employed, with the coating further reducing the likelihood of fiber rupture and/or enhancing surface properties, e.g., inert characteristics and/or smooth surface of the hollow fibers. Exemplary fiber coating materials/systems include polymeric coatings, glass coatings and ceramic coatings.

An example of a polymeric material having application for fabrication of the hollow fibers of the present disclosure is polypropylene. More particularly, polypropylene solid hollow fibers of 420/575 μm ID/OD available from Celgard (Charlotte, N.C.) were found to be suitable for fabrication of two SHFC devices, where module #1 included 35 fibers of 21.9 cm length while module #2 included 35 fibers of 20.3 cm length. Other exemplary polymeric materials include polyethersulfone (PES), polyetheretherketone (PEEK), polyimides, polyphenyl sulfide (PPS), polyethylene, polytetrafluoroethylene (PTFE), polysulfone (PS) and poly-4-methyl-1- pentene (PMP). Exemplary ceramic materials include alumina, silica, glass and the like.

The wall thickness of the disclosed hollow fibers may be tailored depending upon the required heat transfer. For example, a wall thickness of less than 100 µm may provide heat transfer performance comparable to conventional metal equipment. In exemplary embodiments of the present disclosure, overall heat transfer coefficients of 647-1314 $Wm^{-2}K^{-1}$ are achievable with SHFC devices of the type disclosed herein. Due to the low energy surface of polymers, fouling may be less than in metal tubes. Build-up of crystals on the lumen wall of the hollow fibers may have a higher or comparable thermal conductivity to the polymeric wall material, which limits its impact compared to the build-up on metal tubes.

The disclosed hollow fibers may be packed in a variety of configurations within the disclosed SHFC device. For example, the hollow fibers may be packed in a helical manner within the cylindrical shell. Packing in a helical manner may lead to the formation of Dean vortices, which may improve the overall SHFC device performance by increasing the heat transfer coefficient and reducing fouling by sweeping newly formed crystals near the wall. Alternatively and/or in addition, aggressive cleaning of the SHFC may be utilized without any significant loss in heat transfer performance.

The shell of the solid hollow fiber crystallizer may be of any suitable shape, including cylindrical, and may be fabricated of any suitable material depending upon the feed and cooling solutions utilized.

Suitable feed solutions for use in the present disclosure include, but are not limited to, aqueous or organic solutions that contain inorganic/organic microsolutes/macrosolutes. For example, test systems that include aqueous potassium nitrate solutions, salicylic acid in ethanol solutions and aqueous solutions of paracetamol are described herein. However, the advantageous crystallization systems and methods disclosed herein are not limited to such examples, but have wide ranging applicability in various industries and technologies, e.g., pharmaceutical applications, biotechnology applications, protein syntheses, food science applications, catalytic systems, and the like. Thus, the crystallization systems and methods disclosed herein find widespread application, as will be readily apparent to persons skilled in the art.

In another aspect of the present disclosure, the disclosed solid hollow fiber crystallizer (SHFC) is configured with other process equipment/unit operations to effectuate enhanced and/or continued nucleation and/or crystallization. Other process equipment/unit operations may include, but is not limited to, stirred tanks, static mixers, circulation pumps, temperature indicators and controllers, chillers, and/or filtration devices.

For example, FIG. 2 depicts a representative schematic diagram of an experimental set-up 100 for solid hollow fiber cooling crystallization according to an exemplary implementation of the present disclosure. A feed solution 102 maintained at constant temperature by a stirred thermostatic bath 104 is circulated through the lumen side 106 of solid hollow fiber crystallizer SHFC 108 by a diaphragm pump 110. An aqueous cooling solution, for example 33% vol ethylene glycol, is circulated by a second diaphragm pump 112 through the shell side 114 of SHFC 108 after passing by a chiller 116. The inlet and exit temperatures of the two streams are recorded with a series of four thermocouples 118 and a four-channel temperature recorder (not shown) with an accuracy of ±0.2° C. Flow rates are measured by flowmeters (not shown) and confirmed by measuring the time required to collect a certain volume of liquid. Feed solution 102, upon exiting the SHFC 108, may enter a completely stirred tank (CST) 120 and then filters (not shown) or alternatively directly to filters upon exiting SHFC 108. In an alternative configuration, an in-line static mixer or other mixing device may replace the completely stirred tank (CST) 120 in the exemplary system depicted in FIG. 2.

A variety of filter medium types and arrangements are suitable for filtering nuclei/crystals from the feed solution. In exemplary embodiments of the present disclosure, glass fiber filters with a cutoff size of 1.5 µm and hydrophilized polyvinylidenefluoride (PVDF) membrane filters with a cutoff size of 0.2 µm have been shown to be particularly suitable filtration systems. Alternative filtration media and/or filtration systems may be employed to recover/separate nuclei/crystals based on the characteristics of the solution, the nuclei/crystals and other system properties (e.g., concentration, temperature, solvent, etc.), as will be readily apparent to persons of skill in the art.

In yet another aspect of the present disclosure, a solid hollow fiber crystallizer set-up of the general type depicted in FIG. 2 may be configured into various operating modes or approaches for conducting solid hollow fiber cooling crystallization according to the present disclosure. One operating approach for solid hollow fiber crystallization according to the present disclosure is to immediately direct the crystallizing solution from the SHFC to a filtration system. This approach is referred to herein as the "once through mode of operation" and, in this mode, the solid hollow fiber module functions as the primary/sole crystallizer. For example, in the once through mode of operation, the feed solution may be passed through the lumen side of the SHFC and, after about 1-2 minutes, the coolant flow may be switched on. The relative flow rates of the two streams may be set to obtain a value suitable to bring down the feed solution exit temperature about 3-4° C. below the saturation temperature. By way of example, for aqueous $KNO_3$ solutions, the temperature is generally brought down close to the metastable zone width of aqueous $KNO_3$ solutions at room temperature. The exiting feed solution may then be collected, e.g., in a separate tank or beaker, for a period of time, e.g., about 10-15 minutes, and then the flow may be diverted to the filtration system in order to separate the generated crystals for a period of time, e.g., about 1-2 minutes.

A second mode of operation is to recycle the feed solution exiting the SHFC for a certain amount of time and then direct effluent to a filtration system. This mode of operation is referred to as a "feed recycling mode of operation." This mode of operation is particularly useful for feed solutions with slow nucleation kinetics for seeding purposes or, alternatively, if lower levels of supersaturation are desired. In the recycling mode, the solid hollow fiber module functions initially as a nuclei generator and then, after nuclei are formed, as a crystallizer. By way of example, the feed recycle mode of operation may be performed in the same manner as described above for the once through mode of operation, except that a lower degree of undercooling of the feed solution (e.g., 0.6-1.3° C.) may be achieved/utilized. Moreover, the feed stream exiting the SHFC may be recycled for a period of time based on system characteristics, e.g., about 15-20 minutes for an aqueous $KNO_3$ solution system.

A third mode of operation involves directing the supersaturated solution that exits the SHFC to a completely stirred tank (CST) and then to a filtration system. This mode of operation is referred to as the "SHFC-CST in series mode of operation." In the SHFC-CST mode, the solid hollow fiber module functions primarily as a supersaturation generator for generating nuclei in the feed solution. Crystal growth from the nuclei predominately occurs subsequently in the completely stirred tank. Both crystal nucleation and growth may also occur inside the solid hollow fiber module (SHFC), in which case the device acts simultaneously as a crystallizer. The SHFC-CST in series mode is also typically of a single pass or once through nature.

By way of example, for purposes of CST operation, a solution exiting the SHFC may be collected and simultaneously stirred for a period of time, e.g., about 1-2 minutes, in a separate vessel prior to filtration. In exemplary embodiments, the SHFC-CST in series mode may be operated as a semi-batch process. In the SHFC-CST in series mode, the degree of undercooling is typically determined by the operating conditions of the SHFC and may be varied between the values that are typically used for the previously described operating modes, e.g., between 1.5-3.5° C. The same degree of undercooling may be maintained inside the CST. According to exemplary implementations of the disclosed SHFC-CST mode, increased coolant flow rates may be employed, e.g., at least 10 times higher than feed flow rates, and a steady state nucleation/crystallization system may be achieved in a relatively short time, e.g., in as little as about 2-3 minutes.

A fourth mode of operation according to the present disclosure involves conveying the supersaturated solution exiting the SHFC to an in-line static mixer. This mode of operation is referred to as the "SHFC-in-line static mixer in series mode of operation." This mode of operation also permits the decoupling of crystal nucleation and crystal growth. The solid hollow fiber module functions primarily as a supersaturation generator for generating nuclei in the feed solution, and crystal growth from the nuclei predominately occurs subsequently in the in-line static mixer. Both crystal nucleation and growth may occur inside the solid hollow fiber module (SHFC), in which case the device acts simultaneously as a crystallizer. The SHFC-in-line static mixer in series mode is also typically of a single pass or once through nature. By way of example, the feed solution exiting the in-line static mixer may be collected, mixed, and then filtered or filtered immediately upon exiting the static mixer. The SHFC-in-line static mixer in series mode may also be a semi-batch type of process.

Analytical Methods and Comparison with Literature Data

The systems and methods of the present disclosure are further described and illustrated with reference to exemplary implementations thereof. However, the present disclosure is in no way limited by the exemplary implementations described herein. Rather, the disclosed crystallization systems and methods are susceptible to wide ranging implementations and applications, as will be readily apparent to persons skilled in the art.

In an exemplary implementation of the present disclosure, $KNO_3$ solutions were utilized. Feed concentration determinations for the $KNO_3$ solutions were performed using three methods. For fresh feed batches, the feed concentration was determined gravimetrically. In other cases, feed concentration was determined by UV analysis (Hitachi U-2000 spectrophotometer) and/or density measurements. The nitrate ion absorbs weakly ($\epsilon$=7.73 L mole$^{-1}$cm$^{-1}$, standard error 0.8%) at 300.6 nm. The density measurements were performed with an Anton-Paar DMA-46 (Anton Paar, Graz, Austria) density meter at 25° C. The calibration curve used was found to agree within ±0.1% with available literature data[1,2Error! Reference source not found.]. In other exemplary implementations of the present disclosure, salicyclic acid systems were utilized. Salicylic acid concentrations were determined either gravimetrically or by density measurements at 25° C.

Crystal sizing/determinations were performed with a Coulter LS-230 laser diffraction instrument. In all measurements, an optical model based on the complete Mie theory was used. The refractive index of the suspension medium was measured between 20-28° C. with an Abbe-3L refractometer with a precision of 0.0001 refractive index units. The suspension medium used for crystal sizing was denatured alcohol for $KNO_3$ and n-hexane for salicylic acid. The refractive indices of potassium nitrate[3] and salicylic acid[4] were taken from the literature and their values were confirmed in the disclosed testing to the third decimal place by the method of oblique illumination[5]. The shape factor of $KNO_3$ crystals was taken equal to 1 in accordance with literature values[6,7Error! Reference source not found.]. The shape factor of salicylic acid was determined in the disclosed testing by sizing 750 crystals with an optical microscope. The crystals were assumed to be square base parallelepipeds with sides $\beta_1$ and $\beta_2$ ($\beta_1 > \beta_2$) and the shape factor was calculated as 5.03±3.22 according to procedures described in the literature[8].

An additional technique used for crystal sizing in the disclosed testing, but primarily to obtain information about the crystal morphology, was optical microscopy. An optical microscope (Swift Instruments International, M4000-D) equipped with a digital camera and a stage micrometer was used to obtain sample pictures. Crystal sizing was performed with available free imaging software (Image Tool version 3, Univ. of Texas Health Science Center in San Antonio, Tex.), either automatically or manually. When sizing is performed automatically, the software measures the area of the crystal/particle and assigns it to an ellipse. Therefore, the crystal size computed in this manner is based on area and not on volume as in the case for laser diffraction.

Experimental data was compared with existing literature data obtained in mixed suspension mixed product removal (MSMPR) crystallizers. All comparisons were made on the basis of the same relative supersaturation defined as[8]:

$$\sigma = \frac{C - C^*}{C^*} \quad (1)$$

The quantities compared include the mean crystal size $L_{mean}$, its standard deviation (SD), the coefficient of variation (CV), the mode size and the $d_{10}$, $d_{50}$ and $d_{90}$ sizes, which are the sizes corresponding to the $10^{th}$, $50^{th}$ and $90^{th}$ percentiles, respectively, of the undersize volume cumulative crystal size distribution (CSD). The use of this full set of parameters ensures that the comparison is as complete as possible and yields meaningful results. The mean size, the SD and the CV of the CSD are given from the following relationships based on population density values[9]:

$$L_{mean} = \frac{\int_{L_1}^{L_2} L^4 n(L) dL}{\int_{L_1}^{L_2} L^3 n(L) dL} \quad (2)$$

$$SD = \sqrt{\frac{\int_{L_1}^{L_2} (L - L_{mean})^2 L^3 n(L) dL}{\int_{L_1}^{L_2} L^3 n(L) dL}} \quad (3)$$

$$CV = \frac{SD}{L_{mean}} 100\% \quad (4)$$

The number of crystals produced per unit volume, indicative of the nucleation rate achieved, can be found by numerical integration of the population density curve with respect to crystal size:

$$N_c = \int_{L_1}^{L_2} n(L)dL \quad (5)$$

Integration was performed in all cases by using the composite trapezoidal rule. For SHFC runs, the C in equation (1) is equal to the feed concentration $C_f$ while $C^*$ is equal to the saturation concentration of the feed solution $C^*_{f,out}$ at its exit temperature. The saturation concentration was calculated from solubility data available for potassium nitrate[10,11] and salicylic acid[12]. The experimentally obtained magma density was found by[8]:

$$M_T = \frac{m_c}{V_{fil}} \quad (6)$$

The magma density can also be calculated based on a solute mass balance around the crystallizer and the solubility curve.

$$M_T = \frac{\dot{m}_c}{Q_f} = \frac{C_{f,in} - C^*_{f,out}}{Q_f} \dot{m}_s \quad (7)$$

Population densities for the SHFC runs were obtained from the following relationship:

$$n_i(L_i) = \frac{x_{w,i} M_T}{k_v \rho_c L_i^3 \Delta L_i} \quad (8)$$

Equation (8) is based on the assumption that the weight fraction of crystals of size $L_i$ is the same as the volume fraction found from the laser diffraction measurements. Experimentally obtained magma density (equation (6)) was used in all cases for the calculation of the population density.

For treatment of MSMPR literature data, relative supersaturations were calculated from equation (1) based on the inlet and operating temperatures of the MSMPR crystallizer. Magma densities were used as given in the respective references. Crystal sizing was performed by sieving. The crystal size distribution (CSD) characteristics were obtained in the form of the population density curve. The latter was obtained primarily from MSMPR kinetic expressions[8], namely:

$$n_i(L_i) = n^o \exp\left(-\frac{L_i}{G\tau}\right) \quad (9)$$

and on a secondary basis from diagrams read with digital imaging software (Image Tool version 3, Univ. of Texas Health Science Center in San Antonio, Tex.) with an accuracy of 1-2%. Mean size, SD and CV were calculated from equations (2)-(4) with numerical integration between the lower and upper sieve sizes reported. The % weight crystal size distributions, which are directly comparable to the % volume crystal size distributions measured by laser diffraction, were generated based on the following relationships:

$$W_i(L_i) = n_i(L_i) k_v \rho_c L_i^3 \Delta L_i \quad (10)$$

$$x_{w,i} = \frac{W_i(L_i)}{\sum_i W_i(L_i)} \quad (11)$$

The % weight cumulative curve was then constructed and used to find the $d_{10}$, $d_{50}$ and $d_{90}$ sizes with interpolation.

EXAMPLES

Illustrative Example No. 1

KNO$_3$ Crystallization

Aqueous potassium nitrate solutions were prepared by dissolving potassium nitrate (>99%, Sigma Aldrich, St Louis, Mo.) in deionized water. Denatured alcohol (Fisher Scientific Inc., Pittsburgh, Pa.) was used in KNO$_3$ crystal sizing by laser diffraction measurements. Polypropylene solid hollow fibers of 420/575 μm ID/OD (Celgard, Charlotte, N.C.) were used for the fabrication of two almost identical modules. Module #1 was fabricated with 35 fibers of 21.9 cm length, while module #2 had the same number of fibers and an active length of 20.3 cm. The experimental setup used is shown in FIG. 2.

Results obtained with aqueous KNO$_3$ solutions for the SHFC-CST in series and the once through operation modes were compared with those for conventional Mixed Suspension Mixed Product Removal (MSMPR) cooling crystallizers based on literature data[13,14]. The results for the once through and the feed recycling operation modes are similar and the trends or conclusions reported for the once through mode also apply for the feed recycling mode.

In FIG. 3, percent volume differential crystal size distributions are given for the SHFC-CST in series operation mode together with the operating conditions during the runs. The quoted Reynolds numbers are somewhat uncertain, since the literature viscosity data[1] were obtained for slightly more dilute solutions (concentration up to 0.3 g/g). For comparison purposes, a similar CSD obtained from an MSMPR crystallizer[14] is also given. All runs were performed under the same relative supersaturation conditions, and therefore can be directly compared, despite the fact that small operating temperature differences exist. From the results presented in FIG. 3, it is concluded that under the same relative supersaturation conditions, SHFC-CST in series arrangements produce crystals considerably smaller than MSMPR crystallizers. This advantageous result is more evident in FIG. 4, where the % volume cumulative undersize CSD is plotted for the three runs presented in FIG. 3. From FIG. 4, it is evident that 90-95% of the crystals produced are smaller than 300 μm, which compares favorably with the MSMPR run, for which 90% of the crystals produced are smaller than 500-550 μm.

FIG. 5 shows the % volume differential CSDs for two SHFC once through runs together with the operating conditions used, and a MSMPR run[14] performed under the same relative supersaturation conditions. FIG. 6 illustrates the % volume undersize cumulative curves for the same runs. In comparing FIGS. 5 and 6 with FIGS. 3 and 4, it is apparent that in the once through mode of operation, the reproducibility between different runs is lower than for SHFC-CST in series runs. The CSDs obtained are also broader and overlap with the MSMPR curve for a significant size range, which is not observed in FIG. 3. The mode of the CSD curves in FIGS. 3 and 5 falls in the same range of between 100-200 μm. In both operating modes, the SHFC is producing primarily smaller crystals as compared to the MSMPR. This is also apparent in comparing FIG. 6 (Run 2) with FIG. 4. The difference in the once through operation mode is that the CSD broadening can occur at larger sizes. The two SHFC curves in FIG. 5 have approximately the same shape up to a crystal size of about 300 μm, the only difference being the smaller % volume values for Run 8, which can be attributed to the presence of a significant amount of larger crystals. This is also apparent in FIG. 6, where a significant departure of the two curves is observed for sizes above 300 µm.

The population density curves for the runs depicted in FIGS. 3 and 5 are shown in FIGS. 7a and 7b. In FIG. 7b only data for run 8 (FIG. 5) is given, since for run 2 the magma density was not determined experimentally. FIG. 7a shows that SHFC-CST in series arrangements produce a higher number of smaller crystals compared to MSMPR crystallizers. Also, the slope of the curves is much larger, revealing that the CSD can be confined to small sizes and the number of larger crystals produced will be small. Moreover, the two curves show good reproducibility, which starts to break down at a size near 300 µm. The latter, as shown in FIG. 4, corresponds roughly to the $90^{th}$ percentile of the % volume undersize cumulative CSD, showing that variability of the results is significant only for larger crystal sizes, namely, at the high end of the CSD.

FIG. 7a also shows that the nucleation rate in SHFC-CST in series arrangements is at least 1-2 orders of magnitude higher than the respective value for the MSMPR crystallizers. This estimate was based on extrapolating the linear part of the curves between 35-300 µm. Since the kinetics described by equation (9) are not valid for semi-batch operation, this extrapolation may be unreliable. However, for the last measured class size for the MSMPR run, which corresponds to a U.S. No. 200 sieve or 82.5 µm average size, the population density for the SHFC-CST in series runs is already 7 times larger. This difference will be amplified at smaller sizes due to the larger slope of the SHFC-CST in series curves. The situation is quite different for the SHFC once through run shown in FIG. 7b. In this case, the population density curve of the SHFC is below the respective curve of the MSMPR run, for the whole size range measured for the MSMPR (80-1000 µm). At 82.5 µm the population density for the MSMPR is twice that of the SHFC once through run. The apparent nucleation rate achieved by the once through mode of operation seems lower than the respective value for the SHFC-CST in series runs and comparable with the MSMPR values.

More insight on the magnitude of nucleation rate can be obtained from FIG. 8, which is a plot of the generated crystals per unit volume with respect to relative supersaturation for all operation modes and the MSMPR data set. Calculations were performed based on equation (5). It should also be noted that not all once through runs are shown in FIG. 8, since for some of them the magma density was not determined. FIG. 8 shows that under the same relative supersaturation conditions, SHFC-CST in series arrangements produce 2-3 orders of magnitude more crystals than MSMPR crystallizers. Results are more scattered and we attribute this to the semi-batch operation of the CST. A larger amount of crystals, e.g., by about 2 orders of magnitude, is also produced in the once through mode of operation. However, this amount is smaller than the respective number for the SHFC-CST in series runs.

Magma density values give further information on the crystallization kinetics of the experimental apparatus. Ideally, these values should be the same as the value calculated by equation (7). The latter is the value obtained in MSMPR crystallizers, where all supersaturation created is depleted. The experimentally obtained magma densities for both operating modes examined are shown in FIG. 9 and are compared with the calculated values. In the majority of the runs performed, the magma density values obtained are much smaller than the calculated ones. This signifies that all of the supersaturation created in the SHFC setup is not depleted. The situation is better for the SHFC-CST in series arrangement, for which values close to the thermodynamic limit predicted by equation (7) were obtained for about 45% of the runs performed. The variability in the results is primarily attributed to the semi-batch operation of the CST and its small retention time of two minutes or less. The same variability is observed in MSMPR crystallizers during startup.

If the CST were operated in a continuous mode and with a retention time within 1-2 orders of magnitude the retention time of the SHFC, two benefits would be realized. First, there would be an improvement in the reproducibility of the results. Second, magma densities would fall along the solid line shown in FIG. 9, and thus take advantage of all supersaturation created. This would further differentiate the population density values between SHEC-CST in series arrangements and MSMPR crystallizers as shown in FIG. 10, where, one of the runs for which the $M_T$ reached its limiting value, is compared with a MSMPR run. The difference in population density values is much larger than the one in FIG. 7a: at 82.5 µm the n(L) value for the SHFC-CST in series run is about 40 times higher than the respective value for the MSMPR run, which signifies substantially higher nucleation rates for the experimental apparatus.

Higher nucleation rates result from two factors. The first factor is the high surface area/volume ratio of hollow fiber devices facilitating heat transfer, which is the driving force for supersaturation creation. The second factor is the difference between bulk and wall temperature. This difference is between 1-2° C. for the majority of the runs performed and will become higher if higher feed velocities are used. Consequently, the nucleation rate near the wall is higher than what is dictated by the bulk temperature, which is experimentally obtained. Also, since nucleation has a higher power dependence on supersaturation than growth$^{8\text{Error! Reference source not found.}}$, it follows that nucleation is favored over growth in the vicinity of the wall.

Larger crystals exiting the SHFC, visible with the naked eye, have been observed because nucleation occurs near the wall of the solid hollow fibers where the supersaturation created attains its highest values. In the vicinity of the wall, the solution residence time also attains its maximum values. Since the crystal residence time is larger than the solution residence time, some crystals can remain inside the SHFC much longer than the retention time of the SHFC (between 0.5-2 s for all runs) and therefore can grow to a size much larger than the majority of the nuclei/crystals exiting the crystallizer.

FIG. 11 shows optical micrographs of the crystal morphology for exemplary in series and once through operation modes. FIG. 11a shows that the crystals obtained with the SHFC-CST in series operation mode are well formed, rounded and of relatively uniform size. Their morphology is such fast filtration is supported, as is observed in practice. Mixing in the CST plays an important role in the crystal morphology. On the contrary, the crystals obtained with the once through operation mode are needle-like with large aspect ratios. This may be the result of slow filtration in combination with minimal mixing conditions. This combination allows localized growth on the filter under high supersaturation conditions, resulting in broad CSDs as the ones shown in FIG. 5.

FIG. 12 shows a plot of the mean crystal size obtained with respect to relative supersaturation. The mean size obtained for the SHFC-CST in series runs ranges between 95-170 µm, 3-4 times lower than the MSMPR values, which range between 350-450 µm. For the once through mode runs the situation is different. For half of the runs performed, the mean size obtained is between 200-300 µm while for the other half it is almost constant at a value of 450 µm. The SHFC-CST in series arrangement yields a lower variation of the mean crystal size than the MSMPR data, while the mean crystal size for the once through mode runs varies considerably. In particular, in FIG. 12 illustrates the two points corresponding to Run 14 from reference Error! Reference source not found. The point with the lower mean size corresponds to the samples obtained from the crystallizer from the usual sampling point, while the other corresponds to a sample taken from a dead zone inside the crystallizer where mixing is poor. The difference between the two values is evident (about 25%) and shows that significant CSD broadening can occur in MSMPR crystallizers due to poor mixing. It is also indicative of the performance limitations inherent in MSMPR crystallizers. The MSMPR data presented here were taken in a small crystallizer with a volume of only 10 liters. Upon scale up of a MSMPR system, one would anticipate poorer control of mixing intensity and a broader CSD shifting towards larger sizes. These scale-up phenomena are not expected in a SHFC, regardless of the device size.

In FIG. 13, the standard deviation (SD) of the mean crystal size is plotted with respect to relative supersaturation. FIG. 14 shows the respective plot for the CV of the crystal size distribution. From FIG. 13, it is apparent that, for the SHFC-CST in series arrangement, the SD is lower (between 43-115 μm) in absolute terms than the respective values (140-185 μm) for the MSMPR data set. However, the SD for the dead zone point is about 265 μm, markedly higher than the rest of the data set. The SD for the once through mode runs ranged between 140-420 μm, revealing broad CSDs and low reproducibility because of slow filtration and localized growth on the filter. This is also apparent in FIG. 14, from which a CV value of about 80% for the majority of the once through mode runs can be obtained. The CV values for the SHFC-CST in series runs ranged between 45-70%, which is higher than the respective values for the MSMPR data set. This is attributable primarily to the semi-batch operation mode of the CST. In semi-batch crystallizers the generated supersaturation, and hence nucleation and growth, go through a maximum before they attain a relatively stable value[8Error! Reference source not found.]. This can lead to variations in the CSD obtained, especially if one considers the small retention time, 1-2 min, of the CST.

FIG. 15 shows a plot of the mode size of the distribution with respect to relative supersaturation. The mode size for the SHFC-CST in series runs ranged between 88-154 μm, 3-4 times less than the respective range of 328-550 μm for the MSMPR data. Again, the point corresponding to the dead zone is an outlier for the MSMPR data set with a mode size of 780 μm. It is concluded that reproducibility of the mode size is good, especially taking into consideration that for 56% of the SHFC-CST in series runs performed, the mode size ranged between 127-140 μm, which is a relatively narrow range. The mode size for the once through runs ranged between 154-429 μm, values obviously higher than the SHFC-CST in series operation mode but lower than the MSMPR data set. However, this range is confined between 154-245 μm for 65% of the once through runs performed, which is close to the respective range for the SHFC-CST in series operation mode. This confirms that the SHFC is primarily producing small crystals.

FIG. 16 shows that the $d_{10}$ size is reproducible for the SHFC-CST in series runs between 40-65 μm. Slightly lower reproducibility is obtained for the once through runs where the $d_{10}$ size ranged between 72-107 μm. Both operating modes yielded lower $d_{10}$ sizes than the MSMPR crystallizer where the results are considerably more scattered. FIG. 17 shows a plot of the $d_{50}$ size with respect to relative supersaturation. The same trend is evident for the SHFC-CST in series operation mode. The $d_{50}$ size is reproducible for a wide supersaturation range and considerably smaller than the respective CSD characteristic of the MSMPR runs.

The situation is different for the once through mode runs. Reproducibility is already lost at the $d_{50}$ size as is evident from the scatter of the results. Above this size, significant CSD broadening is anticipated, as shown in FIG. 5. FIG. 18 shows the $d_{90}$ size as a function of relative supersaturation. For the once through runs, the scatter of the results and the CSD broadening are apparent. Considerable scatter is also evident in the case of the SHFC-CST in series runs. This shows that loss of reproducibility and broadening occur at the high end of the CSD. However, the significance of the presence of a small number of larger crystals in the case of the SHFC-CST in series runs is larger due to the fact that the CSD is confined to small sizes. The presence of a small number of large crystals can skew significantly the distribution towards the larger size end of the distribution. Moreover, for half of the SHFC-CST in series runs performed, the $d_{90}$ size falls between 200-250 μm representative of a narrow range. Also for all runs, 90% of the crystals produced is smaller than 370 μm. This again indicates that the SHFC-CST in series operating arrangement can be used for the production of small crystals.

Illustrative Example No. 2

Salicylic Acid Crystallization

Solutions of salicylic acid (Fisher Scientific Inc., Pittsburgh, Pa.) were prepared by dissolving salicylic acid in 99.9% ethanol (Sigma Aldrich, St Louis, Mo.). n-Hexane (95% pure, Acros Organics., NJ) was used as the suspension medium for salicylic acid crystal sizing by laser diffraction measurements. Polypropylene solid hollow fibers of 420/575 μm ID/OD (Celgard, Charlotte, N.C.) were used for fabrication of two almost identical modules. Module #1 was made of 35 fibers of 21.9 cm length, while module #2 had the same number of fibers and an active length of 20.3 cm. The experimental setup used is shown in FIG. 2. The salicylic acid in ethanol solution experiments with the SHFC-CST in series operating mode described herein demonstrate that the disclosed system/method, unlike the other membrane based crystallization techniques, can be also applied to organic systems without any differences or additional difficulties compared to aqueous solutions.

FIG. 19 shows typical % volume differential CSDs for salicylic acid crystallization from ethanol solutions. Operating conditions are also shown in FIG. 19. Similar to FIG. 3 for $KNO_3$ crystallization, CSD is confined to relatively small sizes of up to about 400 μm with good reproducibility. Similarly, FIG. 20 shows the % volume undersize cumulative curves for the same runs. The two curves are almost overlapping up to a size of 200 μm, where deviations start to appear. FIG. 20 also shows that the $d_{90}$ size takes values of 300 μm and lower.

Typical population density curves are given in FIG. 21. The population density values shown in FIG. 21 are comparable or higher than the respective values for batch precipitation in stirred vessels[15]. Higher nucleation rates can be achieved with the experimental SHFC device, despite the much lower supersaturations utilized. The population density curves show the same characteristics as the ones in FIG. 7a, which show high values of population density at small sizes followed by a steep decrease at higher sizes due to the large slope of the curve. However, there is a difference between the two curves in FIG. 21 despite the overlap of the % volume undersize cumulative curves shown in FIG. 20. This signifies that the magma density values in the two runs were quite different for the same reasons as for the $KNO_3$ runs.

The experimental results described herein demonstrate that the SHFC apparatus/system achieves the same advantageous performance results, regardless of whether the apparatus is used in connection with an aqueous or organic system. Differences may arise only due to system specific characteristics, such as crystallization kinetics.

The Table below summarizes the characteristics of the crystal size distributions obtained from the four salicylic acid crystallization runs described herein. These results are indicative of the performance that can be achieved in a SHFC-CST in series operation mode. The mean size obtained is small and reproducible. Moreover, the results compare well with mean sizes of 75-102 μm obtained by precipitation in batch stirred crystallizers[16]. The latter results were based on a number distribution and therefore will generally tend to be smaller than the volume average found by ensemble techniques, such as laser diffraction. Also, supersaturation ratios between 2.7-3.4 were used in the batch crystallizer compared to 1.02-1.08 in the disclosed SHFC apparatus. The SD of the mean crystal size, although low in absolute terms, is high compared to the mean size resulting in high CV values. As shown in the following Table, the $d_{10}$, $d_{50}$ and $d_{90}$ sizes are reproducible. Therefore, the high CV values and the CSD broadening are caused by the presence of a small number of large crystals, which are probably produced due to solvent evaporation in the CST or the exit region connecting the SHFC and CST.

TABLE

| CSD characteristic | Range |
| --- | --- |
| Mean Size (μm) | 120-139 |
| SD (μm) | 84-108 |
| CV (%) | 60-83 |
| Mode size (μm) | 128-223 |
| $D_{10}$ size (μm) | 29-35 |
| $D_{50}$ size (μm) | 92-128 |
| $D_{90}$ size (μm) | 243-283 |

Illustrative Example No. 3

Paracetamol Crystallization

Paracetamol (4-amidophenol, acetaminophen) crystallization from its aqueous solutions is an example of an organic system with low solubility. Paracetamol is an over-the-counter analgesic, and a system representative of crystallization applications in the pharmaceutical industry. The experiments presented below illustrate the advantageous performance of the disclosed solid hollow fiber cooling crystallization (SHFCC) systems/methods at considerably higher supersaturation levels, for which the contribution of homogeneous nucleation to the overall nucleation rate is either significant or dominant. This was not possible during the potassium nitrate and salicylic acid runs, which were operated close to or below the metastable zone boundary. In addition, the experiments presented below demonstrate that the disclosed solid hollow fiber cooling crystallization systems/methods can be used to effectively decouple crystal nucleation and crystal growth, with the former being performed by the solid hollow fiber crystallizer (SHFC) and the latter by a mixing device (e.g., CST or static mixer) downstream of the SHFC.

All experiments were performed with an in-line static mixer as opposed to a completely stirred tank downstream of the SHFC. Two samples were obtained during each run. One sample was mixed magnetically for 15-30 seconds and then filtered, while the second sample was filtered immediately as it was coming out of the static mixer. The difference between the two samples/processing modalities further illustrates the effect of mixing in the disclosed SHFC device. The operating conditions during the runs are shown in the concentration-temperature diagram of FIG. 22. The metastable zone was based on literature data up to 45° C.; and for temperatures above 45° C., the metastable zone was estimated based on the assumption that as the solution concentration increases, the metastable zone width decreases. FIG. 22 shows that in the case of a system with a relatively low solubility, it is possible to operate the SHFC deep inside the labile zone, and as low as 40° C. below the solubility curve. Consequently, high nucleation rates, typical of primary nucleation, can be achieved.

The crystal size distributions (CSDs) obtained for the four (4) test runs are shown in FIG. 23 for the magnetically mixed samples and in FIG. 24 for the unmixed samples. CSDs are based on microscopic measurements. Microscopic measurements were chosen over laser diffraction measurements because paracetamol crystals are known to agglomerate heavily, and only in-line measurements, such as Focused Beam Reflectance Measurement (FBRM), can overcome this problem. Crystal agglomeration was confirmed by measuring the mixed sample from Run 1 via laser diffraction. The mode of the distribution occurred at a size of about 40 μm. As shown in FIG. 23, no crystal was measured larger than 150 μm. The crystal sizes presented in FIGS. 23 and 24 correspond to the circle equivalent diameter (CED), namely, the diameter of a circle having the same area as the measured crystal. For each run, at least 650 crystals were measured.

For mixed samples, FIG. 23 shows that for all runs, except run 4, the distributions were similar. The CSD is practically confined between 3-150 μm. These results compare favorably with literature values of 400-600 μm for crystallization from aqueous solutions. However, no quantitative comparison can be made with these results because special algorithms are required to obtain the true CSD from the chord length distributions obtained by FBRM measurements. For unmixed samples, FIG. 24 shows similar trends in terms of excellent reproducibility between runs, and the CSD is confined below 200 μm.

However, for the unmixed samples of FIG. 24, the tail of the distribution at sizes greater than 100 μm is significant. The tail in the CSDs in FIG. 24 and its absence in FIG. 23 reveals different degrees of mixing between the two samples during each run. The same conclusion can be drawn from FIG. 25, which shows a plot of the experimentally obtained magma densities together with calculated thermodynamic limits. FIG. 25 shows that magma densities are smaller than anticipated. Therefore, the SHFC apparatus can still be considered a class I system in which not all supersaturation is relieved. However, it is also apparent that the magma densities of the unmixed samples are higher compared to the values for the once through operation mode. Consequently, the presence of the in-line static mixer serves the purpose of supersaturation depletion. Improved results may be achieved through use of a longer and narrower static mixer, e.g., such mixer would induce the necessary degree of mixing.

It should be highlighted that the SHFCs described herein were small compared to the in-line static mixer ($D_i$~9 mm). Optimally, the static mixer should be chosen such that its cross section is at least 4-5 times smaller than the cross section of the fibers in the SHFC. Translating this requirement to the experimental setup, the diameter of the static mixer could have been advantageously reduced to less than 1 mm. Consequently, the CSDs of FIG. 24 and the results of FIG. 25 are not optimal, but are indicative of the potential of SHFC if operated at a larger scale.

FIGS. 26 and 27 illustrate the % number cumulative undersize CSDs obtained for the mixed and unmixed samples, respectively. FIG. 26 shows that for all runs, 90% of the crystals produced are smaller than 50 µm, and the CSD for all purposes can be considered confined below 100 µm. The $d_{90}$ size of about 70 µm shown in FIG. 27 is higher, and indicates local supersaturation depletion. However, the supersaturations involved in the paracetamol experiments are considerably higher compared to the potassium nitrate runs. As a result, a much larger number of nuclei are present, which can grow in a more uniform way. This same reasoning explains the larger sizes compared to FIG. 26 at the high end of the CSD.

Another observation from FIGS. 26 and 27 is that the crystal sizes obtained for run 1 are markedly smaller than the rest of the runs. This can be explained on the basis of the much higher supersaturation used during this run. Hence, higher nucleation rates were obtained with the contribution of homogeneous nucleation being more significant. The above conclusion is supported by inspecting FIG. 28, which is a plot of the nucleation rate with respect to the inverse of the square of the logarithm of the supersaturation ratio. The nucleation rates shown in FIG. 28 are approximate and were estimated based on the number CSD by dividing the crystal production rate obtained experimentally with the calculated mass of the crystals. The point corresponding to run 1 is an obvious outlier compared to the rest of the runs. It corresponds to an order of magnitude higher nucleation rate, indicating that the nucleation mechanism is possibly different for this run. This was confirmed by calculated values, which show that for run 1, the contribution of homogeneous nucleation starts to become appreciable. These results also show that calculated values are close to experimental values. Therefore, a combination of homogeneous and heterogeneous nucleation is more likely for high supersaturations. The nucleation rates set forth in FIG. 28 are very high, and similar values are obtained only during antisolvent crystallization.

FIG. 29 is a plot of the mean crystal size versus coolant temperature. The mean crystal size is proportional to the coolant temperature, with a lower coolant temperature yielding a smaller crystal size due to higher nucleation rates. Consequently, controlling the coolant temperature in the disclosed systems/methods is a simple means to control the mean crystal size. However, this dependence will be observed primarily in the case of systems with low solubility for which operation in the labile zone is possible, as demonstrated by these experimental results. For soluble systems like potassium nitrate, such a trend was not observed.

In conclusion, the paracetamol experiments demonstrate a different operating regimen for solid hollow fiber cooling crystallization characterized by high supersaturation and primary nucleation. This regimen is important in various applications, e.g., for pharmaceutical molecules and fine chemicals production. It was shown that the mixing conditions inside the SHFC can be used to carry out operations at very high supersaturation levels and essentially decouple the nucleation phenomenon from the crystal growth phenomenon. The high supersaturations applied during the paracetamol runs offer two advantages. First, the nucleation rates achieved are extremely high and considerably higher than the ones obtained in stirred cooling crystallizers. The nucleation rates are also 2-4 orders of magnitude higher than the results presented for potassium nitrate and salicylic acid. Consequently, the mean crystal size is decreased substantially. Second, a high yield can be obtained while operating continuously and for a shorter period of time.

The paracetamol experiments also confirm that mean crystal size can be effectively controlled by manipulating the temperature of the coolant circulated through the shell side of the SHFC. This was not apparent from the potassium nitrate and salicylic acid runs owing to the considerably smaller supersaturation levels applied. The same control capability can be potentially used for crystal morphology control, and preferential unseeded polymorph crystallization.

Applicants have attempted to disclose all embodiments of the present invention that they could reasonably foresee. There may be unforeseeable insubstantial modifications that have not been disclosed, but that nonetheless remain as equivalents. While the present invention has been described in conjunction with specific embodiments thereof, it is evident that many alterations, modifications, and variations will be apparent to those skilled in the art in light of the foregoing description. Accordingly, the present disclosure is intended to embrace all such alterations, modifications, and variations of the above detailed description.

REFERENCES (1) Isono T.; Density, viscosity and electrolytic conductivity of concentrated aqueous solutions at several temperatures. Alkaline-earth chlorides, $LaCl_3$, $Na_2SO_4$, $NaNO_3$, $KNO_3$, KBr and $Cd(NO_3)_2$, *Journal of Chemical & Engineering Data*, 1984, 29, 45.

(2) Daniel V.; Albright J. G.; Measurement of mutual-diffusion coefficients for the system $KNO_3$—$H_2O$ at 25° C., *Journal of Solution Chemistry*, 1991, 20(6), 633.

(3) Lide D. R.; Frederikse H. P. R. (eds); *CRC Handbook of Chemistry and Physics*, $75^{nd}$ ed., CRC Press, Boca Raton, Fla. 1994.

(4) Thomas M. R.; Salicylic acid and related compounds, in *Encyclopedia of Chemical Technology*, $4^{th}$ ed., Vol. 21, pp. 601-626, John Wiley & Sons, New York, 1997.

(5) Phillips W. H.; *Mineral Optics, Principles & Techniques*, W.H. Freeman & Co., San Francisco, 1971.

(6) Miller S. P.; *Modeling and Quality Control Strategies for Batch Cooling Crystallizers*, Ph. D. Thesis, University of Texas at Austin, 1993.

(7) Shor S. M.; Larson M. A.; Effect of additives on crystallization kinetics, *Chemical Engineering Progress Symposium Series*, 1971, 67(110), 32.

(8) Myerson A. S.; *Handbook of Industrial Crystallization*, Butterworth-Heinemann, Boston, Mass. 1993.

(9) Randolph A. D.; Larson M. A.; *Theory of Particulate Processes*, $2^{nd}$ ed., Academic Press, NY 1988.

(10) Rolfs J.; Lacmann R.; Kipp S.; Crystallization of potassium nitrate ($KNO_3$) in aqueous solution. I. Growth kinetics of the pure system, *Journal of Crystal Growth*, 1997, 171, 174.

(11) Perry R. H.; Green D.; *Perry's Chemical Engineers' Handbook*, 6th ed., p. 3-99, McGraw-Hill, NY 1984.

(12) Stephen H.; Stephen T.; *Solubilities of Inorganic and Organic Compounds*, Volume 1, Part 2, McMillan Co., NY 1963.

(13) Helt J. T.; Larson M. A.; Effects of temperature on the crystallization of potassium nitrate by direct measurement of supersaturation, *AIChE Journal*, 1977, 23(6), 822.

(14) Juzaszek P.; Larson M. A.; Influence of fines dissolving on crystal size distribution in an MSMPR crystallizer, *AIChE Journal*, 1977, 23(4), 460.

(15) Tavare N. S.; Gaikar V. G.; Precipitation of salicylic acid: Hydrotropy and reaction, *Industrial Engineering Chemistry & Research*, 1991, 30, 722.

(16) Blandin A. F.; Mangin D.; Nallet V.; Klein J. P.; Bossoutrot J. M.; Kinetics identification of salicylic acid precipitation through experiments in a batch stirred vessel and a T-mixer, *Chemical Engineering Journal*, 2001, 81, 9A1.

NOMENCLATURE

C=actual concentration, kg/kg

C*=saturation concentration, kg/kg $d_{10}$=crystal size corresponding to the 10$^{th}$ percentile of the cumulative undersize curve $d_{50}$=crystal size corresponding to the 50$^{th}$ percentile of the cumulative undersize curve $d_{90}$=crystal size corresponding to the 90$^{th}$ percentile of the cumulative undersize curve G=linear growth rate, µm s$^{-1}$ $k_v$=volume shape factor $\Delta L$=class size interval, µm L=crystal size, µm $L_1$=lower crystal size measured, µm $L_2$=upper crystal size measured, µm $L_{mean}$=mean crystal size, µm m=mass, kg ṁ=mass flow rate, kg s$^{-1}$ $M_T$=magma density, kg/m$^3$ $N_c$=number of crystals generated per unit volume, no m$^{-3}$ n=population density, no m$^{-3}$ µm$^{-1}$ n°=population density of crystal nuclei, no m$^{-3}$ µm$^{-1}$ Q=volumetric flow rate, m$^3$ s$^{-t}$ Re=Reynolds number, dimensionless T=temperature, ° C.

V=volume, m$^3$

W=weight, kg $x_w$=weight fraction

*=saturation condition c=crystal calc=calculated co=coolant

CST=completely stirred tank exp=experimental f=feed fil=filtrate i=crystal class in=inlet condition out=outlet condition s=solvent ρ=density σ=relative supersaturation τ=mean retention time SHFC=solid hollow fiber crystallizer SHFCC=solid hollow fiber cooling crystallization CST=completely stirred tank

The invention claimed is:

1. A method of forming nuclei and subsequently crystals in a feed solution, comprising the steps of:
   a) conveying said feed solution into a solid hollow fiber crystallizer (SHFC) system, said solid hollow fiber crystallizer system including a plurality of non-porous hollow fibers mounted within a shell and said feed solution being conveyed to either a lumen side or a shell side of said plurality of non-porous hollow fibers;
   b) conveying a cooling solution into said solid hollow fiber crystallizer, said cooling solution being conveyed to an opposite side of said plurality of non-porous hollow fibers as compared to said feed solution;
   c) cooling said feed solution below its saturation temperature to form nuclei and crystals; and
   d) conveying said cooled feed solution into a mixing device.

2. The method of claim 1, further comprising the steps of:
   a) controlling crystal size distribution in said cooled feed solution within said mixing device,
   b) conveying a cooled feed solution from said mixing device, and
   c) filtering nuclei and crystals from said cooled feed solution.

3. The method of claim 1, wherein the mixing device is selected from the group consisting of a completely stirred tank and an in-line static mixer.

4. The method of claim 1, wherein said solid hollow fiber crystallizer (SHFC) system is effective to cause crystal nucleation, and said mixing device is effective to cause crystal growth.

5. The method of claim 1, wherein said feed solution is selected from the group consisting of an aqueous solution and an organic solution.

6. The method of claim 1, wherein said feed solution includes an inorganic or organic solute.

7. The method of claim 1, wherein said feed solution includes at least one of microsolutes and macrosolutes.

8. The method of claim 1, further comprising the step of subjecting said feed solution that contains nuclei and crystals to filtration.

9. The method of claim 1, further comprising the step of recycling said cooled feed solution back through said solid hollow fiber crystallizer system.

10. The method of claim 1, wherein said hollow fiber crystallizer system comprises a bundle of non-porous polymeric or ceramic hollow fibers mounted within said shell.

11. The method of claim 10, wherein said hollow fiber crystallizer system includes a bundle of non-porous hollow fibers fabricated from a polymeric material selected from the group consisting of polypropylene, polyethersulfone (PES), polyetheretherketone (PEEK), a polyimide, polyphenyl sulfide (PPS), polyethylene, polytetrafluoroethylene (PTFE), polysulfone (PS) and poly-4-methyl-1-pentene (PMP).

12. The method of claim 10, wherein said hollow fiber crystallizer system includes a bundle of non-porous hollow fibers fabricated from a ceramic material selected from the group consisting of alumina, silica and glass.

13. The method of claim 1, wherein a temperature difference between said feed solution temperature and said chilled cooling solution is less than or equal to 2° C.

14. The method of claim 1, wherein said plurality of hollow fibers is oriented in a helix within said shell.

15. The method of claim 1, wherein said feed solution includes seed crystals and wherein said solid hollow fiber crystallizer (SHFC) system is effective to grow said seed crystals.

* * * * *